US011682693B2

(12) United States Patent
Kim et al.

(10) Patent No.: US 11,682,693 B2
(45) Date of Patent: *Jun. 20, 2023

(54) DISPLAY DEVICE

(71) Applicant: Samsung Display Co., Ltd., Yongin-si (KR)

(72) Inventors: Dong Uk Kim, Hwaseong-si (KR); Hyun Min Cho, Seoul (KR); Keun Kyu Song, Seongnam-si (KR); Dae Hyun Kim, Hwaseong-si (KR); Jung Hong Min, Pyeongtaek-si (KR); Seung A Lee, Seoul (KR); Hyung Rae Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/316,339

(22) Filed: May 10, 2021

(65) Prior Publication Data

US 2021/0265419 A1  Aug. 26, 2021

Related U.S. Application Data

(63) Continuation of application No. 16/275,794, filed on Feb. 14, 2019, now Pat. No. 11,004,892.

(30) Foreign Application Priority Data

Aug. 6, 2018 (KR) .................. 10-2018-0091429

(51) Int. Cl.
  *H01L 27/15*  (2006.01)
  *H01L 33/50*  (2010.01)
  *H01L 33/60*  (2010.01)
(52) U.S. Cl.
  CPC .......... *H01L 27/156* (2013.01); *H01L 33/504* (2013.01); *H01L 33/60* (2013.01);
(Continued)

(58) Field of Classification Search
  CPC .. H01L 25/0753; H01L 33/504; H01L 27/156; H01L 27/153; H01L 33/502
  See application file for complete search history.

(56) References Cited

U.S. PATENT DOCUMENTS 8,872,214 B2   10/2014 Negishi et al.
11,004,892 B2 *  5/2021 Kim ..................... H01L 33/504
(Continued)

FOREIGN PATENT DOCUMENTS

EP      3270424 A1     1/2018
JP    2015-072895 A    4/2015
(Continued)

OTHER PUBLICATIONS

EPO Extended Search Report dated Nov. 11, 2019, for corresponding European Patent Application No. 19170321.4, (8 pages).

*Primary Examiner* — Changhyun Yi
(74) *Attorney, Agent, or Firm* — Lewis Roca Rothgerber Christie LLP

(57) ABSTRACT

A display device includes a first pixel and a second pixel; a light emitting layer; a color conversion layer on the light emitting layer; and a color filter layer on the color conversion layer, the light emitting layer including one or more light emitting elements in the first pixel and the second pixel, the color conversion layer including a first color conversion layer in the first pixel and a second color conversion layer in the second pixel. The color filter layer includes a first color filter layer in the first pixel and a second color filter layer in the second pixel, the light emitting elements capable of emitting a first light having a first wavelength, each of the first color conversion layer and the second color conversion layer including first color conversion particles and second color conversion particles.

20 Claims, 26 Drawing Sheets

(52) U.S. Cl.
CPC .................. *H01L 2933/0041* (2013.01); *H01L 2933/0058* (2013.01)

(56) References Cited

U.S. PATENT DOCUMENTS

| | | |
|---|---|---|
| 2015/0060916 A1 | 3/2015 | Nagasaki et al. |
| 2015/0362165 A1 | 12/2015 | Chu et al. |
| 2017/0236866 A1 | 8/2017 | Lee et al. |
| 2017/0263828 A1 | 9/2017 | Mao et al. |
| 2018/0175009 A1 | 6/2018 | Kim et al. |
| 2018/0175106 A1 | 6/2018 | Kim et al. |
| 2019/0252579 A1 | 8/2019 | Choi et al. |
| 2019/0295996 A1 | 9/2019 | Park et al. |
| 2020/0058701 A1 | 2/2020 | Kim et al. |

FOREIGN PATENT DOCUMENTS

| | | |
|---|---|---|
| KR | 10-2010-0089606 A | 8/2010 |
| KR | 10-1490758 B1 | 2/2015 |
| KR | 10-2017-0062707 A | 6/2017 |
| KR | 10-1782889 B1 | 9/2017 |
| KR | 10-2018-0002933 A | 1/2018 |
| KR | 10-2018-0063687 A | 6/2018 |
| KR | 10-2018-0072909 A | 7/2018 |
| KR | 10-2019-0120467 A | 10/2019 |

\* cited by examiner

DISPLAY DEVICE

CROSS-REFERENCE TO RELATED APPLICATIONS

This application is a continuation of U.S. patent application Ser. No. 16/275,794, filed on Feb. 14, 2019, which claims priority to and the benefit of Korean Patent Application No. 10-2018-0091429, filed on Aug. 6, 2018, in the Korean Intellectual Property Office, the entire content of each of which is incorporated herein by reference.

BACKGROUND

1. Field

Embodiments of the present disclosure relate to a display device, for example, to a display device including an array of inorganic light emitting diodes (LEDs).

2. Description of the Related Art

With the development of multimedia, display devices are becoming increasingly important. Accordingly, various suitable types (or kinds) of display devices such as liquid crystal displays and organic light emitting displays are being used.

A display device is a device for displaying an image, and includes a display panel such as an organic light emitting display panel or a liquid crystal display panel. Among them, a light emitting display panel may include light emitting elements such as light emitting diodes (LEDs). For example, the LEDs may be organic light emitting diodes (OLEDs) using an organic material as a fluorescent material or inorganic LEDs using an inorganic material as the fluorescent material.

An OLED that uses an organic material as a fluorescent material of a light emitting element can be manufactured according to a simple process and may have a flexible characteristic. However, the organic material has been found to be vulnerable to a high-temperature driving environment and to have a relatively low efficiency of blue light.

On the other hand, an inorganic LED that uses an inorganic semiconductor as the fluorescent material is durable even in a high-temperature environment and has higher blue light efficiency than the OLED. In addition, a transfer method using dielectrophoresis (DEP) has been developed for a manufacturing process which has been pointed out as a limitation of existing inorganic LEDs. Therefore, research is being continuously conducted on inorganic LEDs having better durability and efficiency than OLEDs.

A display device may include a plurality of pixels, and each of the pixels may display blue, green, or red light. Here, if light emitting elements emitting light of different colors are used, the same process is repeatedly performed several times (e.g., three times) in order to align the light emitting elements during the manufacture of the display device. Alternatively, if the light emitting elements in the pixels emit light of the same color and color conversion layers are used to display light of different colors, the process of aligning the light emitting elements is performed, and the process of forming a color conversion layer is repeatedly performed several times in order to form color conversion layers of different colors. Accordingly, this can increase the manufacturing cost of the display device or reduce the yield.

SUMMARY

Aspects of embodiments of the present disclosure provide a display device which includes two different kinds of color conversion particles and the same light emitting elements.

Aspects of embodiments of the present disclosure also provide a method of manufacturing a display device, the method capable of reducing the manufacturing cost of the display device and increasing the yield by reducing the number of processes required to align light emitting elements and form color conversion layers.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description of the present disclosure given below.

According to an aspect of an embodiment of the present disclosure, a display device comprising: a first pixel and a second pixel; a light emitting layer; a color conversion layer which is disposed on the light emitting layer; and a color filter layer which is disposed on the color conversion layer, wherein the light emitting layer comprises one or more light emitting elements disposed in the first pixel and the second pixel, the color conversion layer comprises a first color conversion layer disposed in the first pixel and a second color conversion layer disposed in the second pixel, and the color filter layer comprises a first color filter layer disposed in the first pixel and a second color filter layer disposed in the second pixel, wherein the light emitting elements emit first light whose central wavelength band is a first wavelength, each of the first color conversion layer and the second color conversion layer comprises first color conversion particles for converting the first light into second light having a second wavelength longer than the first wavelength and second color conversion particles for converting the first light into third light having a third wavelength longer than the second wavelength, the first color filter layer transmits the first light and blocks transmission of the second light and the third light, and the second color filter layer transmits the second light and blocks transmission of the first light and the third light.

In an exemplary embodiment, the display device further comprising a third pixel, wherein the light emitting layer further comprises one or more light emitting elements disposed in the third pixel, the color conversion layer further comprises a third color conversion layer disposed in the third pixel, and the color filter layer further comprises a third color filter layer disposed in the third pixel, wherein the third color conversion layer comprises the first color conversion particles and the second color conversion particles, and the third color filter layer transmits the third light and blocks transmission of the first light and the second light.

In an exemplary embodiment, wherein each of the first color filter layer, the second color filter layer and the third color filter layer receive a mixture of the first light, the second light and the third light.

In an exemplary embodiment, wherein the first color conversion particles and the second color conversion particles are dispersed in the first color conversion layer, the second color conversion layer and the third color conversion layer, and the density of the second color conversion particles dispersed in the second color conversion layer is greater than those of the second color conversion particles dispersed in the first color conversion layer and the third color conversion layer.

In an exemplary embodiment, wherein the amount of the second light incident on the second color filter layer is greater than those of the second light incident on the first color filter layer and the third color filter layer.

In an exemplary embodiment, wherein the first light has a central wavelength band of about 430 nm to about 470 nm, the second light has a central wavelength band of about 530 nm to about 570 nm, the third light has a central wavelength band of about 630 nm to about 670 nm, and the color conversion particles comprise a quantum dot material.

In an exemplary embodiment, wherein the light emitting layer further comprises barrier ribs, and the first pixel, the second pixel and the third pixel are arranged sequentially in a first direction, wherein the barrier ribs comprise one or more electrode barrier ribs disposed in the first pixel, the second pixel and the third pixel and one or more pixel barrier ribs disposed between the first pixel, the second pixel and the third pixel.

In an exemplary embodiment, wherein each of the pixel barrier ribs comprises a first sub-pixel barrier rib and a second sub-pixel barrier rib disposed on the first sub-pixel barrier rib.

In an exemplary embodiment, wherein the second sub-pixel barrier rib covers the first sub-pixel barrier rib and surrounds an outer surface of the first sub-pixel barrier rib.

In an exemplary embodiment, wherein at least a portion of the first light emitted from each light emitting element is reflected by the pixel barrier ribs to the color conversion layer.

In an exemplary embodiment, wherein the electrode barrier ribs comprise a first electrode barrier rib and a second electrode barrier rib spaced apart from the first electrode barrier rib to face the first electrode barrier rib, and the light emitting layer comprises a first region defined as a region between the first electrode barrier rib and the second electrode barrier rib and a second region defined as a space between the electrode barrier ribs and the pixel barrier ribs.

In an exemplary embodiment, wherein each of the light emitting elements is disposed between the first electrode barrier rib and the second electrode barrier rib, and the color conversion layer is disposed over the first region and the second region.

In an exemplary embodiment, wherein at least some of the color conversion particles of the color conversion layer are disposed on each light emitting element, and at least some of the color conversion particles are disposed on sides of each light emitting element in the second region.

In an exemplary embodiment, wherein at least a portion of the first light emitted from each light emitting element is reflected by the electrode barrier ribs.

In an exemplary embodiment, the display device further comprising: a first planarization layer which is disposed on the light emitting layer to cover the light emitting elements; a second planarization layer which is disposed under the color conversion layer and planarizes a lower surface of the color conversion layer; and an adhesive layer which is disposed between the first planarization layer and the second planarization layer, wherein the first planarization layer, the adhesive layer and the second planarization layer are stacked between the light emitting layer and the color conversion layer.

According to another embodiment of the present application, the display device comprising: a base layer; barrier ribs which are disposed on the base layer and separate an internal space inside the barrier ribs from an external space outside the barrier ribs; one or more light emitting elements which are disposed on the base layer in the internal space; a color conversion layer which is disposed over the internal space and the external space; and a color filter layer which is disposed on the color conversion layer, wherein the light emitting elements emit first light whose central wavelength band is a first wavelength, and the color conversion layer comprises first color conversion particles for converting the first light into second light having a second wavelength longer than the first wavelength and second color conversion particles for converting the first light into third light having a third wavelength longer than the second wavelength.

In an exemplary embodiment, wherein the first color conversion particles and the second color conversion particles are disposed over the light emitting elements and side portions in the external space which are parallel (e.g., substantially parallel) to each light emitting element.

In an exemplary embodiment, wherein light incident on the barrier ribs among at least a portion of the first light emitted from the light emitting elements is reflected by the barrier ribs, and at least a portion of the reflected first light is incident on the first color conversion particles and the second color conversion particles.

In an exemplary embodiment, wherein the color filter layer receives the first light emitted from the light emitting elements, the second light emitted from the first color conversion particles, and the third light emitted from the second color conversion particles.

In an exemplary embodiment, wherein the color filter layer comprises: a first color filter layer which transmits the first light and blocks transmission of the second light and the third light; a second color filter layer which transmits the second light and blocks transmission of the first light and the third light; and a third color filter layer which transmits the third light and blocks transmission of the first light and the second light.

BRIEF DESCRIPTION OF THE DRAWINGS

The above and other aspects and features of the subject matter of the present disclosure will become more apparent by describing in more detail exemplary embodiments thereof with reference to the attached drawings, in which.

DETAILED DESCRIPTION

The subject matter of the present disclosure will now be described more fully hereinafter with reference to the accompanying drawings, in which embodiments of the present disclosure are shown. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Hereinafter, embodiments will be described with reference to the accompanying drawings.

Figure 1:
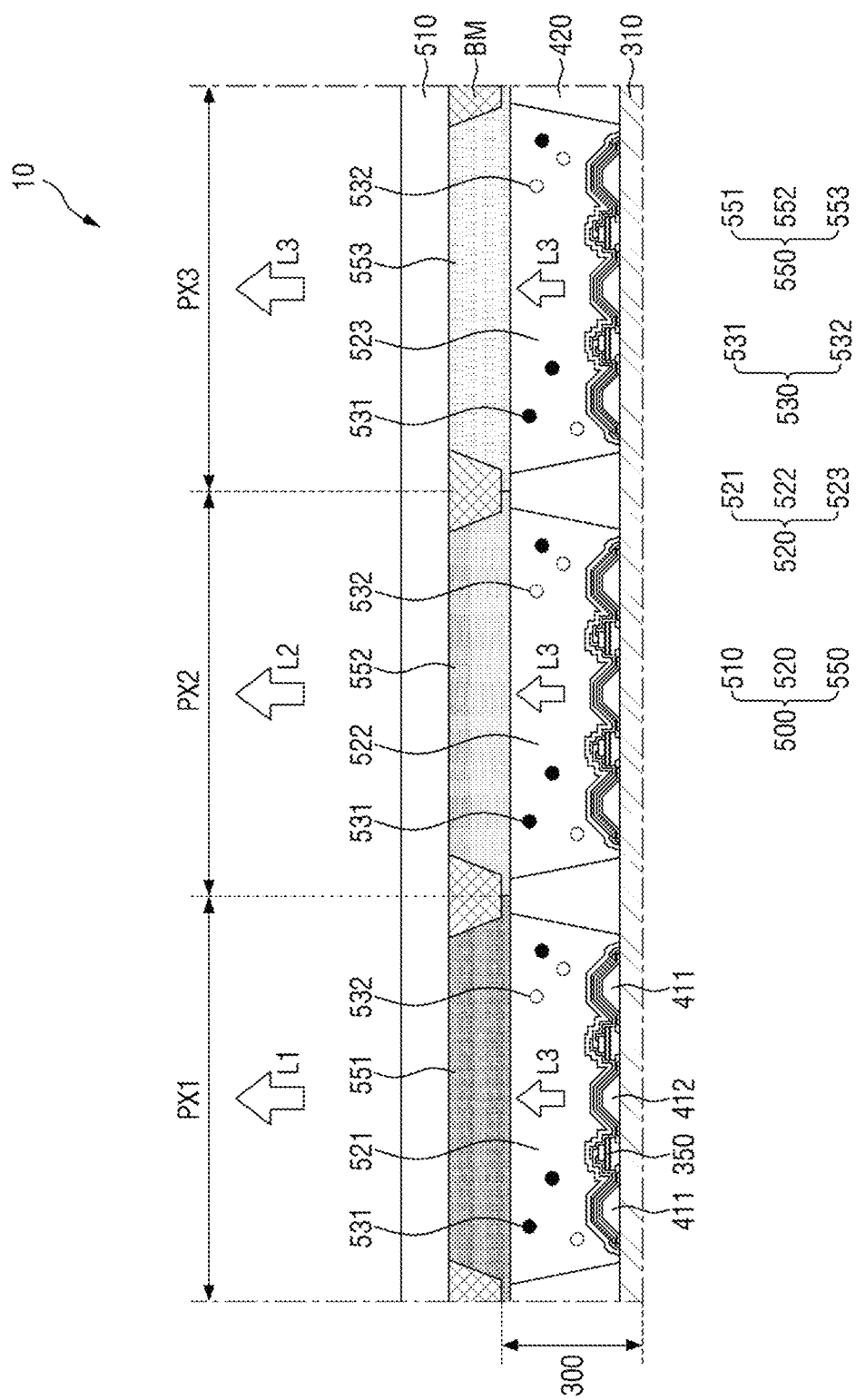
FIG. 1 is a cross-sectional view of a display device according to an embodiment.

FIG. 1 is a cross-sectional view of a display device 10 according to an embodiment.

The display device 10 may include at least one region defined as a pixel PX. A plurality of pixels PX may be disposed in a display unit of the display device 10 and may each emit light of a set or specific wavelength band to the outside of the display device 10. Although three pixels PX1 through PX3 are illustrated in FIG. 1 by way of example, it is apparent that the display device 10 may include a larger number of pixels. In the drawing, a plurality of pixels PX arranged only in one direction in cross section are illustrated. However, a plurality of pixels PX may also be arranged in a direction intersecting the above direction.

The pixels PX may include light emitting elements 350 to display different colors. For example, a first pixel PX1 may emit light of a first color L1, a second pixel PX2 may emit light of a second color L2, and a third pixel PX3 may emit light of a third color L3. In an embodiment, the pixels PX may include the light emitting elements 350 that emit light of the same color, but may include color conversion layers 520 for converting light emitted from the light emitting elements 350 into light of different colors. Thus, the pixels PX can display different colors. In some cases, adjacent pixels PX may emit light of the same color.

In an exemplary embodiment, a central wavelength band of the first color L1 is longer than a central wavelength band of the second color L2, and the central wavelength band of the second color L2 is longer than a central wavelength band of the third color L3. For example, the first color L1 may be red having a central wavelength band of about 610 nm to about 650 nm, the second color L2 may be green having a central wavelength band of about 530 nm to about 570 nm, and the third color L3 may be blue having a central wavelength band of about 430 nm to about 470 nm. However, the first color L1, the second color L2 and the third color L3 are not particularly limited as long as they have different central wavelength bands. In the present specification, a case where the first color L1 is red, the second color L2 is green and the third color L3 is blue and where the first pixel PX1 emits red light L1, the second pixel PX2 emits green light L2 and third pixel PX3 emits blue light L3 will be described as an example.

The display device 10 according to the embodiment may include a circuit unit which is electrically coupled to (e.g., electrically connected to) the light emitting elements 350 of each light emitting unit 300 and controls light emission of the light emitting elements 350, the light emitting units 300, each of which includes the light emitting elements 350 to provide light of a set or specific wavelength band, and a color conversion unit 500 which converts light received from each of the light emitting units 300 into light of another wavelength band. Some structures of each light emitting unit 300 and the color conversion unit 500 may overlap each other in a thickness direction. For example, since the color conversion unit 500 is formed directly on the light emitting units 300, outer barrier ribs 420 and the color conversion layers 520, which are elements of the light emitting units 300 and the color conversion unit 500, may partially overlap each other. The light emitting units 300 and the color conversion unit 500 may include regions overlapping the pixels PX of the display device 10.

In FIG. 1, the light emitting units 300 are briefly illustrated for ease of description. The structure of the light emitting units 300 is illustrated in more detail in FIGS. 2-3. The light emitting units 300 and the color conversion unit 500 of the display device 10 will now be described in more detail.

Figure 2:
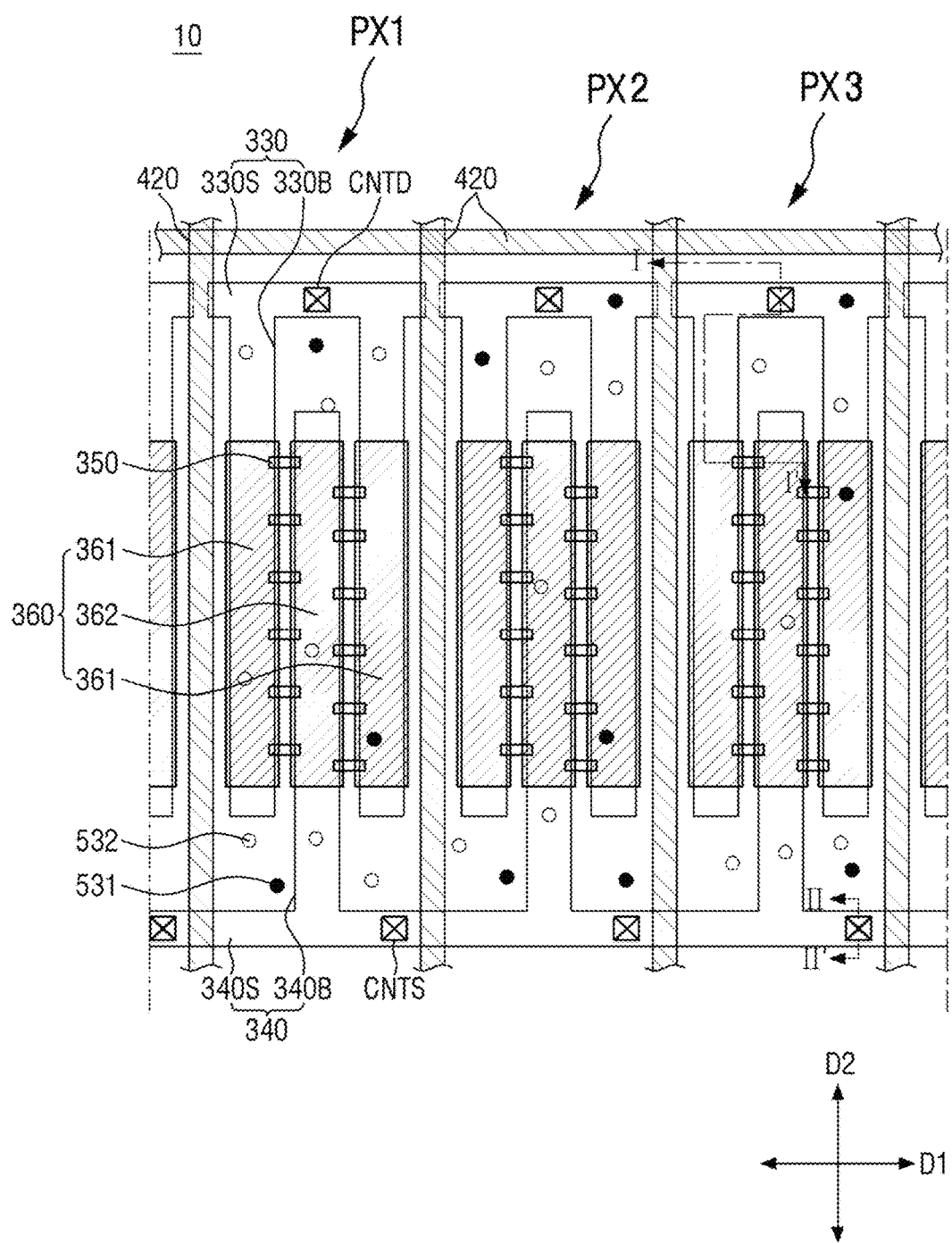
FIG. 2 is a plan view of light emitting units according to an embodiment.

FIG. 2 is a plan view of light emitting units 300 according to an embodiment.

Referring to FIG. 2, each of the light emitting units 300 includes a plurality of electrodes 330 and 340 and a plurality of light emitting elements 350. Each of the light emitting elements 350 may emit light of a set or specific wavelength band to the color conversion unit 500 which will be described herein below. Although the light emitting units 300 overlapping three pixels PX are illustrated in FIG. 2, it is apparent that a larger number of the light emitting units 300 may be provided. In addition, although a plurality of light emitting units 300 arranged only in a first direction D1 are illustrated in the drawing, a plurality of light emitting units 300 may also be arranged in a second direction D2 intersecting the first direction D1. In some embodiments, each light emitting unit 300 may be divided into a plurality of segments, each forming one light emitting unit 300.

Each of the light emitting units 300 may emit light of a set or specific color by including one or more light emitting element 350 which emit light of a set or specific wavelength band. Light emitted from the light emitting elements 350 may be provided to the color conversion unit 500 to be described herein below and may be displayed outside the display device 10 through the color conversion unit 500. In an embodiment, the light emitting units 300 may include the light emitting elements 350 that emit light of the same color, for example, the blue light L3. In this case, only one kind of light emitting element 350 may be manufactured and, as will be described herein below, aligned on the light emitting units 300 through only one process during the manufacture of the light emitting units 300. Accordingly, the manufacturing cost of the light emitting units 300 can be reduced, and the process yield can be improved because the same process is performed only once.

The light emitting units 300 may include a plurality of outer barrier ribs 420. The outer barrier ribs 420 may be disposed at boundaries between adjacent regions in which the light emitting units 300 respectively overlap the pixels PX in order to separate the regions. In the drawing, the outer barrier ribs 420 extending in the first direction D1 and the second direction D2 intersecting the first direction D1 are illustrated. The outer barrier ribs 420 extending in the same (e.g., substantially the same) direction may be spaced apart to face each other. In addition, the outer barrier ribs 420 extending in the first direction D1 may intersect at least parts of the outer barrier ribs 420 extending in the second direction D2. For example, the outer barrier ribs 420 may be arranged in a substantially lattice pattern.

The outer barrier ribs 420 may not only separate regions in which the light emitting units 300 respectively overlap the pixels PX, but also prevent the light emitting elements 350 in each light emitting unit 300 from moving (or reduce a likelihood or amount of such movement) to the light emitting units 300 of other adjacent pixels PX when the light emitting elements 350 are aligned as will be described herein below. In addition, the outer barrier ribs 420 may reflect light emitted from the light emitting elements 350 to the color conversion unit 500.

The outer barrier ribs 420 may be pixel barrier ribs surrounding each pixel PX. For example, the outer barrier ribs 420 may be formed in a lattice shape along the boundary of each pixel PX to define each pixel PX. Alternatively, the outer barrier ribs 420 may surround a plurality of pixels PX. For example, when pixels PX representing the same color are disposed adjacent to each other, the outer barrier ribs 420 may be arranged to surround all of the pixels PX of the same color.

In FIG. 2, the outer barrier ribs 420 are arranged to surround the electrodes 330 and 340. The electrodes 330 and 340 may be disposed in each region in which a light emitting unit 300 overlaps a pixel PX and may be separated by the outer barrier ribs 420 from the electrodes 330 and 340 disposed in an adjacent region in which a light emitting unit 300 overlaps a pixel PX. For example, one first electrode 330 and one second electrode 340 may be disposed in each region surrounded by the outer barrier ribs 420. In each region in which a pixel PX overlaps a light emitting unit 300, one first electrode 330 and one second electrode 340 may be disposed, but the present disclosure is not limited to this case.

In other words, the outer barrier ribs 420 may be arranged to surround each region in which a light emitting unit 300 overlaps a pixel PX. However, the present disclosure is not limited to this case. In some embodiments, the outer barrier ribs 420 may be arranged to surround a plurality of regions. For example, the outer barrier ribs 420 may be arranged to surround at least one region in which a light emitting unit 300 and a pixel PX overlap each other. In this case, since the light emitting units 300 include the light emitting elements 350 that emit light of the same color as described above, the outer barrier ribs 420 may not be disposed between adjacent regions in which the light emitting units 300 respectively overlap the pixels PX.

Figure 3:
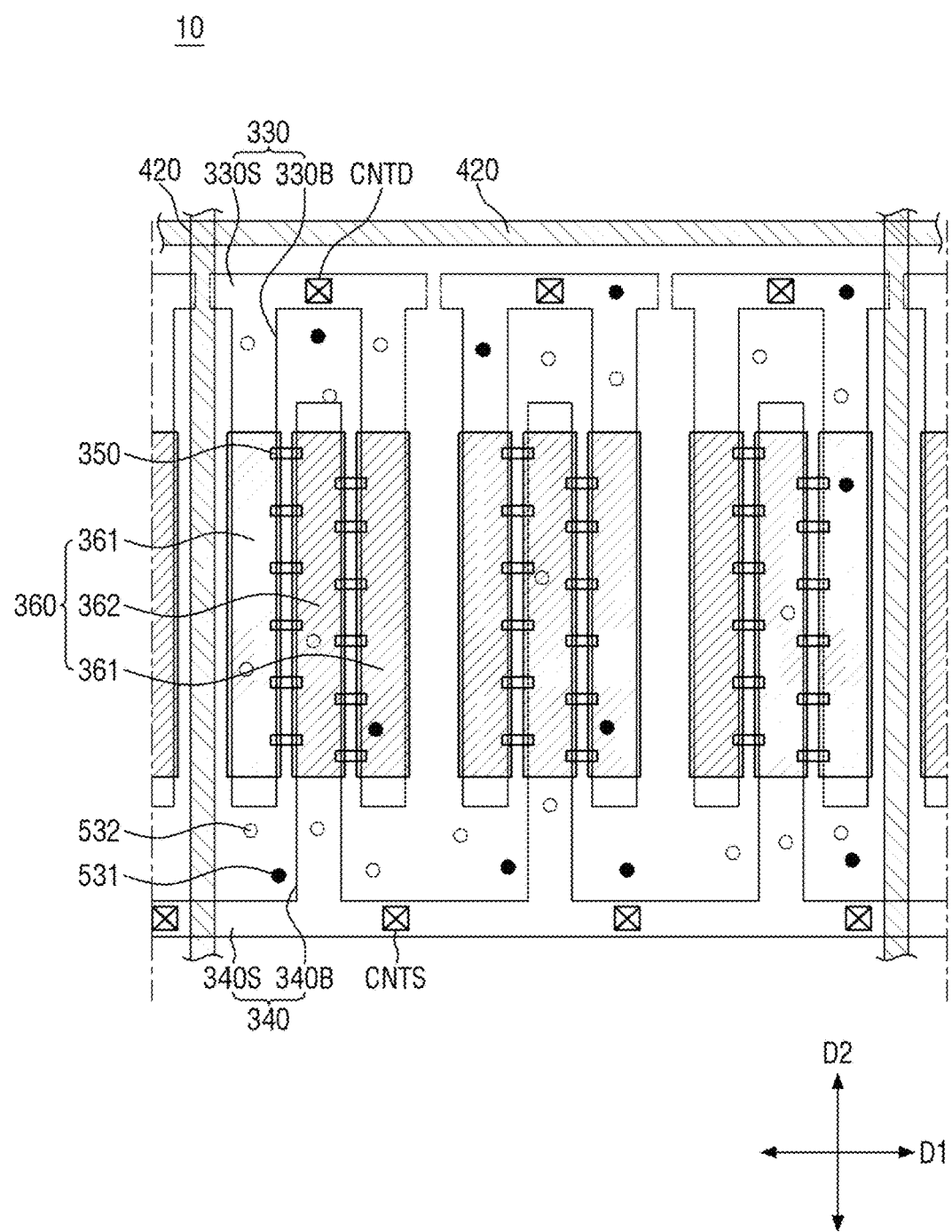
FIG. 3 is a plan view of a light emitting unit according to an embodiment.

FIG. 3 is a plan view of a light emitting unit 300 according to an embodiment.

In a display device 10 of FIG. 3, one or more electrodes 330 and 340 may be disposed in a region surrounded by outer barrier ribs 420, unlike in FIG. 2. As will be described herein below, a plurality of light emitting elements 350 disposed between a plurality of electrodes 330 and 340 may emit light of the same color. Accordingly, a light emitting unit 300 overlapping each pixel PX of the display device 10 may include one or more electrodes 330 and 340. In FIG. 3, three first electrodes 330 and three second electrodes 340 are disposed in a region surrounded by the outer barrier ribs 420. However, the present disclosure is not limited to this case, and a larger number of the electrodes 330 and 340 may also be disposed in the region surrounded by the outer barrier ribs 420.

Referring again to FIG. 2, each of the light emitting units 300 may include a plurality of electrodes 330 and 340 and a plurality of light emitting elements 350. At least a part of each of the electrodes 330 and 340 may be disposed in each light emitting unit 300 and electrically coupled to (e.g., electrically connected to) the light emitting elements 350 and may transmit an electrical signal to the light emitting elements 350 so that the light emitting elements 350 can emit light of a set or specific color.

In addition, at least a part of each of the electrodes 330 and 340 may be utilized to form an electric field in each light emitting unit 300 in order to align the light emitting elements 350. For example, in order to align the light emitting elements 350 in each light emitting unit 300 using dielectrophoresis (DEP), a solution containing the light emitting elements 350 may be applied to each light emitting unit 300, and then AC power may be supplied to each light emitting unit 300 coated with the solution to form capacitance due to an electric field. Accordingly, a dielectrophoretic force may be applied to the light emitting elements 350, thereby aligning the light emitting elements 350.

The electrodes 330 and 340 may include a first electrode 330 and a second electrode 340. In an exemplary embodiment, the first electrode 330 may be a separate pixel electrode disposed in each pixel PX, and the second electrode 340 may be a common electrode formed over a plurality of pixels PX. In an embodiment, any one of the first electrode 330 and the second electrode 340 is an anode of each light emitting element 350, and the other is a cathode of each light emitting element 350, and vice versa.

Each of the first electrode 330 and the second electrode 340 may include an electrode stem portion 330S or 340S extending in the first direction D1 and at least one electrode branch portion 330B or 340B extending and branching from the electrode stem portion 330S or 340S in the second direction D2 intersecting the first direction D1.

For example, the first electrode 330 may include a first electrode stem portion 330S extending in the first direction D1 and at least one first electrode branch portion 330B branching from the first electrode stem portion 330S and extending in the second direction D2. In some embodiments, the first electrode stem portion 330S may have an end coupled to (e.g., connected to) a signal application pad and the other end extending in the first direction D1 and electrically isolated between the pixels PX. The signal application pad may be coupled to (e.g., connected to) the display device 10 or an external power source so as to transmit an electrical signal to the first electrode stem portion 330S or to supply AC power when the light emitting elements 350 are aligned.

The first electrode stem portion 330S of one arbitrary pixel PX may lie on substantially the same straight line as the first electrode stem portion 330S of a neighboring pixel PX (e.g., adjacent in the first direction D1) belonging to the same row. In other words, both ends of the first electrode stem portion 330S of one pixel PX may end between pixels PX, but the first electrode stem portion 330S of a neighboring pixel PX may be aligned on an extension of the first electrode stem portion 330S of the one pixel PX. This arrangement of the first electrode stem portions 330S may be achieved by forming one stem electrode in a manufacturing process and then cutting the stem electrode using a laser or the like after the alignment process of the light emitting elements 350. Accordingly, the first electrode stem portions 330S respectively disposed in the pixels PX may transmit different electrical signals to their respective first electrode branch portions 330B, and the first electrode branch portions 330B may be driven separately.

The first electrode branch portion 330B may branch from at least a part of the first electrode stem portion 330S and extend in the second direction D2 to end at a position spaced apart from the second electrode stem portion 340S facing the first electrode stem portion 330S. For example, the first electrode branch portion 330B disposed in each pixel PX may have an end coupled to (e.g., connected to) the first electrode stem portion 330S and the other end spaced apart from the second electrode stem portion 340S. Since the first electrode branch portion 330B is coupled to (e.g., connected to) the first electrode stem portion 330S which is electrically isolated in each pixel PX, a different electrical signal may be transmitted to the first electrode branch portion 330B in each pixel PX.

In addition, one or more first electrode branch portions 330B may be disposed in each pixel PX. Although two first electrode branch portions 330B are disposed in FIG. 2, the present disclosure is not limited to this case, and a plurality of first electrode branch portions 330B can be disposed. In this case, the first electrode branch portions 330B may be spaced apart from each other and may each be spaced apart from a second electrode branch portion 340B to be described herein below. In some embodiments, the second electrode branch portion 340B may be disposed between the first electrode branch portions 330B. Therefore, each light emitting unit 300 may have a symmetrical structure with respect to the second electrode branch portion 340B. Alternatively, one first electrode branch portion 330B and one second electrode branch portion 340B may be disposed.

The second electrode 340 may include a second electrode stem portion 340S extending in the first direction D1 and spaced apart from the first electrode stem portion 330S and at least one second electrode branch portion 340B branching from the second electrode stem portion 340S, extending in the second direction D2 and spaced apart from the first electrode branch portions 330B to face the first electrode branch portions 330B. Like the first electrode stem portion 330S, the second electrode stem portion 340S may have an end coupled to (e.g., connected to) a signal application pad. However, the other end of the second electrode stem portion 340S may extend to a plurality pixels PX adjacent in the first direction D1. For example, the second electrode stem portion 340S may be electrically coupled between (e.g., electrically connected between) the pixels PX. Accordingly, both ends of the second electrode stem portion 340S in one arbitrary pixel PX may be coupled to (e.g., connected to) respective ends of the second electrode stem portions 340S of neighboring pixels PX between the pixels PX. Thus, the same electrical signal may be transmitted to each pixel PX.

The second electrode branch portion 340B may branch from at least a part of the second electrode stem portion 340S and extend in the second direction D2 to end at a position spaced apart from the first electrode stem portion 330S. For example, the second electrode branch portion 340B disposed in each light emitting unit 300 may have an end coupled to (e.g., connected to) the second electrode stem portion 340S and the other end spaced apart from the first electrode stem portion 330S. Since the second electrode branch portion 340B is coupled to (e.g., connected to) the second electrode stem portion 340S which is electrically coupled between (e.g., electrically connected between) adjacent pixels PX of overlapping the light emitting units 300, the same electrical signal may be transmitted to each pixel PX of overlapping the light emitting unit 300.

In addition, the second electrode branch portion 340B may be spaced apart from the first electrode branch portions 330B to face the first electrode branch portions 330B. Here, since the first electrode stem portion 330S and the second electrode stem portion 340S are spaced apart to face each other in opposite directions with respect to the center of each pixel PX of the light emitting unit 300, the first electrode branch portions 330B and the second electrode branch portion 340B may extend in opposite directions. In other words, the first electrode branch portions 330B may extend in one direction of the second direction D2, and the second electrode branch portion 340B may extend in the other direction of the second direction D2. Thus, respective ends of the first and second branch portions 330B and 340B may be disposed in opposite directions with respect to the center of each light emitting unit 300. However, the present disclosure is not limited to this case, and the first electrode stem portion 330S and the second electrode stem portion 340S may also be disposed in the same (e.g., substantially the same) direction with respect to the center of each pixel PX and spaced apart from each other. In this case, the first electrode branch portions 330B and the second electrode branch portion 340B respectively branching from the first and second electrode stem portions 330S and 340S may extend in the same (e.g., substantially the same) direction.

The light emitting elements 350 may be aligned between the first electrode branch portions 330B and the second electrode branch portion 340B. For example, at least some of the light emitting elements 350 may have respective ends electrically coupled to (e.g., electrically connected to) the first electrode branch portions 330B and the other respective ends electrically coupled to (e.g., electrically connected to) the second electrode branch portion 340B. In addition, contact electrodes 360 may be respectively disposed on the first and second electrode branch portions 330B and 340B coupled to (e.g., connected to) the light emitting elements 350. The contact electrodes 360 may contact the light emitting elements 350 so that the light emitting elements 350 are electrically coupled to (e.g., electrically connected to) the first and second electrode branch portions 330B and 340B. The contact electrodes 360 may contact at least sides of both ends of each light emitting element 350. Accordingly, the light emitting elements 350 may receive an electrical signal and emit light of a set or specific color.

In some embodiments, respective ends of the light emitting elements 350 contacting the first electrode branch portions 330B may be p-type doped conductive material layers, and the other respective ends of the light emitting elements 350 contacting the second electrode branch portion 340B may be n-type doped conductive material layers, and vice versa.

As illustrated in FIG. 2, the first electrode stem portion 330S and the second electrode stem portion 340S may be electrically coupled to (e.g., electrically connected to) a thin-film transistor 120 and a power supply wiring 161, which will be described herein below, via contact holes, for example, a first electrode contact hole CNTD and a second electrode contact hole CNTS, respectively. Although the contact holes on the first electrode stem portion 330S and the second electrode stem portion 340S are disposed in each light emitting unit 300 in FIG. 2, the present disclosure is not limited to this case. Since the second electrode stem portion 340S extends to and electrically coupled to (e.g., electrically connected to) adjacent light emitting units 300 as described above, it may be electrically coupled to (e.g., electrically connected to) a thin-film transistor via one contact hole in some embodiments.

In addition, as will be described herein below, the color conversion layers 520 disposed on the light emitting units 300 may include color conversion particles 531 and 532, and the color conversion particles 531 and 532 may be disposed adjacent to a plurality of members disposed on the light emitting units 300. As illustrated in FIG. 2, the color conversion particles 531 and 532 disposed on the light emitting units 300 may be dispersed in regions adjacent to the light emitting elements 350. This will be described in more detail herein below.

The structure of the members disposed on the light emitting units 300 will be described in more detail with reference to FIG. 4.

Figure 4:
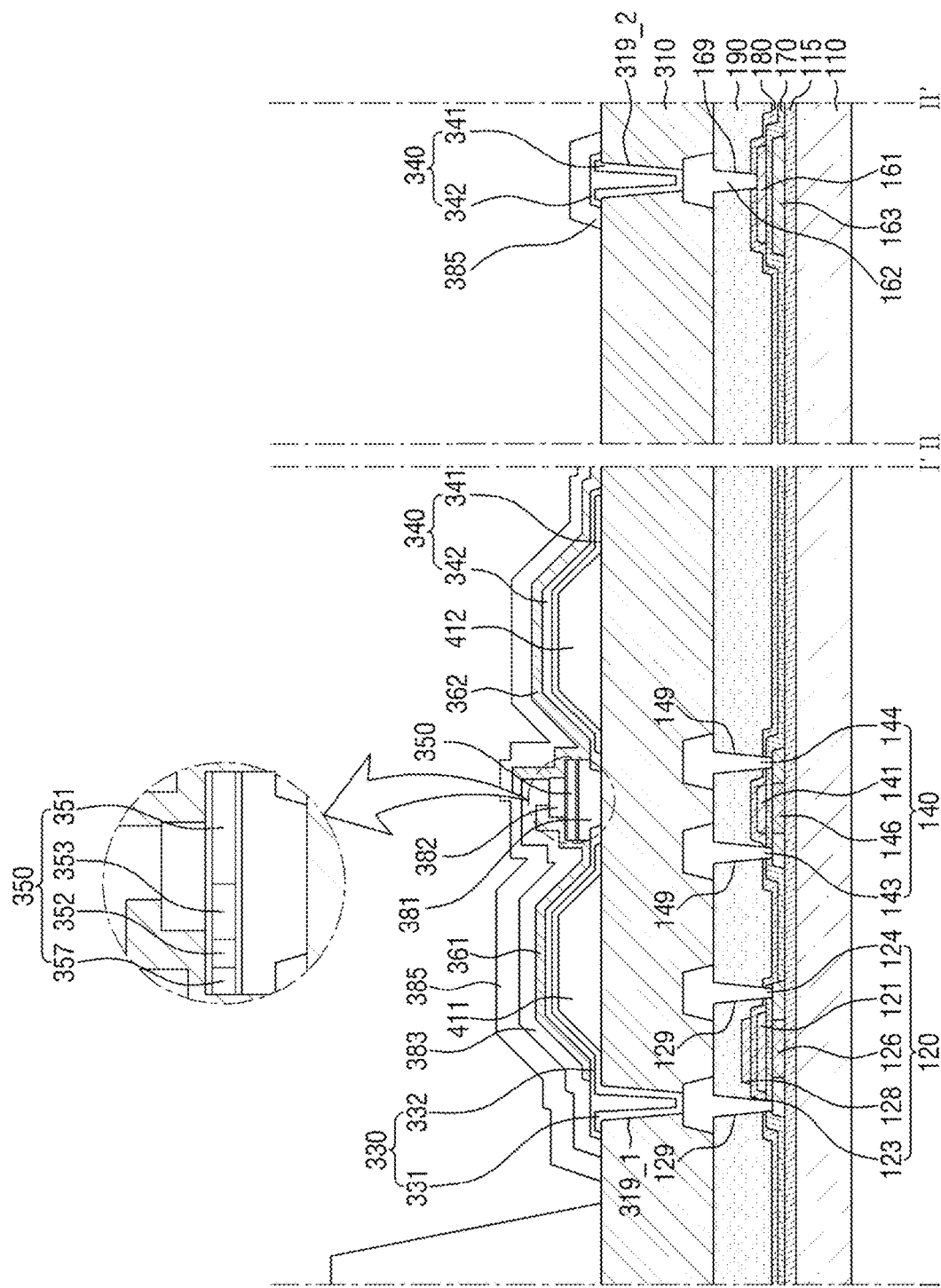
FIG. 4 is a cross-sectional view taken along lines I-I' and II-II' of FIG. 2.

FIG. 4 is a cross-sectional view taken along lines I-I' and II-II' of FIG. 2. Although the light emitting unit 300 of only one pixel PX is illustrated in FIG. 4, the same can be applied to the light emitting units 300 of other pixels PX. In addition, the line I-I' of FIG. 2 may be a line traversing both ends of a light emitting element 350 in contact with one first electrode branch portion 330B and one second electrode branch portion 340B. Accordingly, in FIG. 4, one first electrode 330 and one second electrode 340 are illustrated, and the other first electrode 330 may be omitted. The structure and shape of the omitted first electrode 330 and members disposed on the omitted first electrode 330 may be substantially the same as those of the first electrode 330 and members disposed on the first electrode 330 illustrated in FIG. 4.

Referring to FIGS. 2-4, the display device 10 may include a substrate 110, thin-film transistors 120 and 140 disposed on the substrate 110, and the electrodes 330 and 340 disposed above the thin-film transistors 120 and 140, and a light emitting element 350. The thin-film transistors 120 and 140 may include a first thin-film transistor 120 which is a driving transistor and a second thin-film transistor 140 which is a switching transistor. Each of the thin-film transistors 120 and 140 may include an active layer, a gate electrode, a source electrode, and a drain electrode. The first electrode 330 may be electrically coupled to (e.g., electrically connected to) the drain electrode of the first driving transistor.

For example, the substrate 110 may be an insulating substrate. The substrate 110 may be made of an insulating material such as glass, quartz, or polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations of these materials. The substrate 110 may be a rigid substrate or a flexible substrate that can be bent, folded, or rolled.

A buffer layer 115 may be disposed on the substrate 110. The buffer layer 115 may prevent or reduce diffusion of impurity ions, prevent or reduce penetration of moisture or outside air, and perform a surface planarization function. The buffer layer 115 may include silicon nitride, silicon oxide, or silicon oxynitride.

A semiconductor layer is disposed on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, monocrystalline silicon, or an oxide semiconductor.

A first gate insulating layer 170 is disposed on the semiconductor layer. The first gate insulating layer 170 covers the semiconductor layer. The first gate insulating layer 170 may function as a gate insulating film of thin-film transistors. The first gate insulating layer 170 may include silicon oxide, silicon nitride, silicon oxynitride, aluminum oxide, tantalum oxide, hafnium oxide, zirconium oxide, titanium oxide, etc. These materials may be used alone or in combination with each other.

A first conductive layer is disposed on the first gate insulating layer 170. The first conductive layer includes a first gate electrode 121 disposed on the first active layer 126 of the first thin-film transistor 120 with the first gate insulating layer 170 interposed between them, a second gate electrode 141 disposed on the second active layer 146 of the second thin-film transistor 140 with the first gate insulating layer 170 interposed between them, and a power supply wiring 161 disposed on the auxiliary layer 163 with the first gate insulating layer 170 interposed between them. The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be a single film or a multilayer film.

A second gate insulating layer 180 is disposed on the first conductive layer. The second gate insulating layer 180 may be an interlayer insulating film. The second gate insulating layer 180 may be made of an inorganic insulating material such as silicon oxide, silicon nitride, silicon oxynitride, hafnium oxide, aluminum oxide, titanium oxide, tantalum oxide, or zinc oxide.

A second conductive layer is disposed on the second gate insulating layer 180. The second conductive layer includes a capacitor electrode 128 disposed on the first gate electrode 121 with the second gate insulating layer 180 interposed between them. The capacitor electrode 128 may form a storage capacitor with the first gate electrode 121.

Like the first conductive layer, the second conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

An interlayer insulating layer 190 is disposed on the second conductive layer. The interlayer insulating layer 190 may be an interlayer insulating film. Further, the interlayer insulating layer 190 may perform a surface planarization function. The interlayer insulating layer 190 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

A third conductive layer is disposed on the interlayer insulating layer 190. The third conductive layer includes a first drain electrode 123 and a first source electrode 124 of the first thin-film transistor 120, a second drain electrode 143 and a second source electrode 144 of the second thin-film transistor 140, and a power supply electrode 162 disposed on the power supply wiring 161.

The first source electrode 124 and the first drain electrode 123 may respectively be electrically coupled to (e.g., electrically connected to) the first active layer 126 via first contact holes 129 penetrating the interlayer insulating layer 190 and the second gate insulating layer 180. The second source electrode 144 and the second drain electrode 143 may respectively be electrically coupled to (e.g., electrically connected to) the second active layer 146 via second contact holes 149 penetrating the interlayer insulating layer 190 and the second gate insulating layer 180. The power supply electrode 162 may be electrically coupled to (e.g., electrically connected to) the power supply wiring 161 via a third contact hole 169 penetrating the interlayer insulating layer 190 and the second gate insulating layer 180.

The third conductive layer may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be a single film or a multilayer film. For example, the third conductive layer may have a stacked structure of Ti/Al/Ti, Mo/Al/Mo, Mo/AlGe/Mo, or Ti/Cu.

An insulating substrate layer 310 is disposed on the third conductive layer. The insulating substrate layer 310 may be made of an organic material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The surface of the insulating substrate layer 310 may be flat.

A plurality of outer barrier ribs 420 may be disposed on the insulating substrate layer 310. As described above, the outer barrier ribs 420 may be disposed at the boundaries of the light emitting units 300 to separate the light emitting units 300. In addition, although one outer barrier rib 420 is illustrated in the drawing, a larger number of the outer barrier ribs 420 may be arranged in a substantially lattice pattern. The first electrode 330, the second electrode 340, the light emitting element 350, etc. are disposed between the outer barrier ribs 420. In some embodiments, at least some of the outer barrier ribs 420 may cover electrode lines of the display device 10.

The outer barriers 420 may prevent the light emitting element 350 from moving (or reduce a likelihood or amount of such movement) to other adjacent pixels PX when the light emitting element 350 is aligned on the light emitting unit 300. If a solution containing the light emitting element 350 is applied onto the light emitting unit 300, it may exist within a region formed by the outer barriers 420 due to surface tension. Accordingly, the solution may be prevented from flowing to other pixels PX adjacent to the light emitting unit 300 (or a likelihood or amount of such flow may be reduced), and the light emitting element 350 may be placed only in a desired region. For example, the outer barrier ribs 420 may include polyimide (PI). The outer barrier ribs 420 may include a hydrophobic material, or their surfaces may be hydrophobic-treated.

However, the present disclosure is not limited to the above case. As described above, the light emitting unit 300 may include light emitting elements 350 that emit light of the same color, for example, light emitting elements 350 that emit the blue light L3. For example, in some cases, the solution may move beyond the outer barrier ribs 420 to other pixels PX adjacent to the light emitting unit 300.

In addition, the outer barriers 420 may reflect light that is not incident on the color conversion unit 500 among light emitted from the light emitting element 350. The light emitted from the light emitting element 350 may be displayed outside the display device 10 through the color conversion unit 500. However, some of the light may be emitted not to the color conversion unit 500, but to the outer barrier ribs 420 or other adjacent regions. Here, the light directed toward the outer barrier ribs 420 may be reflected by the outer barrier ribs 420 to the color conversion unit 500. This can minimize or reduce the loss of light emitted from the light emitting element 350 and concentrate light onto the color conversion unit 500, thereby improving light efficiency.

A plurality of inner barrier ribs 410 may be disposed on the insulating substrate layer 310 in the region formed by the outer barrier ribs 420. The inner barrier ribs 410 are spaced apart to face each other in the light emitting unit 300, and the first electrode 330 and the second electrode 340 may be disposed on the inner barrier ribs 410, for example, a first inner barrier rib 411 and a second inner barrier rib 412, respectively. In FIGS. 2-4, two inner barrier ribs 410 are disposed in one pixel PX of the light emitting unit 300, and the first electrode 330 and the second electrode 340 are disposed on the two inner barrier ribs 410, respectively.

However, the present disclosure is not limited to the above case, and two or more inner barrier ribs 410 may also be disposed in one pixel PX of the light emitting unit 300. For example, the inner barrier ribs 410 may include one or more first inner barrier ribs 411 on which the first electrode 330 is disposed and one or more second inner barrier ribs 411 on which the second electrode 340 is disposed. In this case, the first inner barrier ribs 411 and the second inner barrier ribs 412 may be spaced apart to face each other and may be alternately arranged in one direction. In some embodiments, two first inner barrier ribs 411 may be spaced apart from each other, and one second inner barrier rib 412 may be disposed between the first inner barrier ribs 411 spaced apart from each other.

The inner barrier ribs 410 and the outer barrier ribs 420 may be formed of substantially the same material in one process. For example, the inner barrier ribs 410 may include polyimide (PI). In this case, the inner barrier ribs 410 and the outer barrier ribs 420 may form one lattice pattern. However, while the first electrode 330 and the second electrode 340 are disposed on the inner barrier ribs 410, no electrodes are disposed on the outer barrier ribs 420. The inner barrier ribs 410 and the outer barrier ribs 420 formed in the same process may have different shapes so that they can be distinguished from each other. In some embodiments, the inner and outer barrier ribs 410 and 420 may be formed to have different structures using a halftone mask or a slit mask, or an additional process may be performed on the outer barrier ribs 420 so that the outer barrier ribs 420 can be distinguished from the inner barrier ribs 410. This will be described in more detail herein below.

A first barrier rib reflective layer 331 and a second barrier rib reflective layer 341 may be disposed on the inner barrier ribs 410.

The first barrier rib reflective layer 331 covers the first inner barrier rib 411 and is electrically coupled to (e.g., electrically connected to) the first drain electrode 123 of the first thin-film transistor 120 via a fourth contact hole 319_1 penetrating the insulating substrate layer 310. The second barrier rib reflective layer 341 is spaced apart from the first barrier rib reflective layer 331. The second barrier rib reflective layer 341 covers the second inner barrier rib 412 and is electrically coupled to (e.g., electrically connected to) the power supply electrode 162 via a fifth contact hole 319_2 penetrating the insulating substrate layer 310. The first barrier rib reflective layer 331 may be electrically coupled to (e.g., electrically connected to) the first drain electrode 123 of the first thin-film transistor 120 via the fourth contact hole 319_1 in the light emitting unit 300. The first thin-film transistor 120 may be disposed in a region overlapping the light emitting unit 300.

In FIG. 4, the second barrier rib reflective layer 341 is coupled via (e.g., connected via) the fifth contact hole 319_2 in the light emitting unit 300 of one pixel PX. However, the present disclosure is not limited to this case, and the second barrier rib reflective layer 341 may also be coupled to (e.g., connected to) the fifth contact hole 319_2 in a region other than the light emitting unit 300 of one pixel PX.

A non-emission region in which the light emitting elements 350 are not disposed may exist in a region other than the light emitting units 300, for example, in a region outside the light emitting units 300. As described above, the second electrodes 340 of the light emitting units 300 may be electrically coupled to (e.g., electrically connected to) each other by the second electrode stem portion 340S to receive the same electrical signal. In some embodiments, in the case of the second electrodes 340, the second electrode stem portion 340S may be electrically coupled to (e.g., electrically connected to) the power supply electrode 162 via one contact hole in the non-emission region located on the periphery of the display device 10. Accordingly, the same electrical signal may be transmitted to the second electrode branch portions 340B coupled to (e.g., connected to) the second electrode stem portion 340S. However, the position of the contact hole through which the second electrodes 340 receive an electrical signal from the power supply electrode 162 may vary depending on the structure of the display device 10.

Meanwhile, light emitted from the light emitting element 350 may travel in all directions without directionality. Of the light, light incident on the inner barrier ribs 410, for example, light incident on the first barrier rib reflective layer 331 and the second barrier rib reflective layer 341 disposed on the inner barrier ribs 410 may be reflected to the outside of the display device 10 or to the color conversion unit 500. The light emitted from the light emitting element 350 may be incident on color conversion particles 530 of a color conversion layer 520 which will be described herein below. The first barrier rib reflective layer 331 and the second barrier rib reflective layer 341 disposed on the inner barrier ribs 410 may reflect the light emitted from the light emitting element 350 to concentrate the light into the color conversion particles 530. In addition, the first barrier rib reflective layer 331 and the second barrier rib reflective layer 341 may cause the light emitted from the light emitting element 350 to enter a color filter layer 550 to be described herein below, thereby increasing the light efficiency of the display device 10.

The first barrier rib reflective layer 331 and the second barrier rib reflective layer 341 may include a material having high reflectivity in order to reflect light emitted from the light emitting element 350. For example, the first barrier rib reflective layer 331 and the second barrier rib reflective layer 341 may include a material such as silver (Ag) or copper (Cu).

At least a part of each of the inner barrier ribs 410 may protrude from the insulating substrate layer 310. Each of the inner barrier ribs 410 may protrude upward from a plane in which the light emitting element 350 is disposed, and at least a part of the protruding portion may slope. The first barrier rib reflective layer 331 and the second barrier rib reflective layer 341 disposed on the protruding and sloping inner barrier ribs 410 may reflect incident light. Light directed from the light emitting element 350 to the first barrier rib reflective layer 331 and the second barrier rib reflective layer 341 may be reflected to the outside of the display device 10, for example, to above the inner barrier ribs 410.

A first barrier rib electrode layer 332 and a second barrier rib electrode layer 342 may be disposed on the first barrier rib reflective layer 331 and the second barrier rib reflective layer 341, respectively.

The first barrier rib electrode layer 332 is disposed directly on the first barrier rib reflective layer 331. The first barrier rib electrode layer 332 may have substantially the same pattern as the first barrier rib reflective layer 331. The second barrier rib electrode layer 342 is disposed directly on the second barrier rib reflective layer 341. The second barrier rib electrode layer 342 is separated from the first barrier rib electrode layer 332. The second barrier rib electrode layer 342 may have substantially the same pattern as the second barrier rib reflective layer 341.

In an embodiment, the first barrier rib electrode layer 332 and the second barrier rib electrode layer 342 may cover the first barrier rib reflective layer 331 and the second barrier rib reflective layer 341, respectively. For example, the first barrier rib electrode layer 332 and the second barrier rib electrode layer 342 may be formed larger than the first barrier rib reflective layer 331 and the second barrier rib reflective layer 341 to cover side surfaces of respective ends of the first barrier rib reflective layer 331 and the second barrier rib reflective layer 341.

The first barrier rib electrode layer 332 and the second barrier rib electrode layer 342 may transmit electrical signals, which are transmitted to the first barrier rib reflective layer 331 and the second barrier rib reflective layer 341, to contact electrodes which will be described herein below, respectively. The first and second barrier rib electrode layers 332 and 342 may include a transparent conductive material. For example, the first barrier rib electrode layer 332 and the second barrier rib electrode layer 342 may include a material such as indium tin oxide (ITO), indium zinc oxide (IZO), or indium tin-zinc oxide (ITZO). In some embodiments, the first and second barrier rib reflective layers 331 and 341 and the first and second barrier rib electrode layers 332 and 342 may form a structure in which one or more transparent conductive layers such as ITO, IZO or ITZO and one or more metal layers such as silver or copper are stacked. For example, the first and second barrier rib reflective layers 331 and 341 and the first and second barrier rib electrode layers 332 and 342 may form a stacked structure of ITO/silver (Ag)/ITO.

The first barrier rib reflective layer 331 and the first barrier rib electrode layer 332 disposed on the first inner barrier rib 411 constitute the first electrode 330. The first electrode 330 may protrude from both ends of the first inner barrier rib 411. Accordingly, the protruding regions of the first electrode 330 may contact the insulating substrate layer 310. In addition, the second barrier rib reflective layer 341 and the second barrier rib electrode layer 342 disposed on the second inner barrier rib 412 constitute the second electrode 340. The second electrode 340 may protrude from both ends of the second inner barrier rib 412. Accordingly, the protruding regions of the second electrode 340 may contact the insulating substrate layer 310.

The first electrode 330 and the second electrode 340 may cover the entire region (or substantially the entire region) of the first inner barrier rib 411 and the entire region (or substantially the entire region) of the second inner barrier rib 412, respectively. The first electrode 330 and the second electrode 340 are spaced apart to face each other. A first insulating layer 381 may be disposed in the space between the first electrode 330 and the second electrode 340 as will be described herein below, and the light emitting element 350 may be disposed on the first insulating layer 381.

In addition, the first barrier rib reflective layer 331 may receive a driving voltage from the first thin-film transistor 120, and the second barrier rib reflective layer 341 may receive a power supply voltage from the power supply wiring 161. Therefore, the first electrode 330 and the second electrode 340 may receive the driving voltage and the power supply voltage, respectively. As will be described herein below, a first contact electrode 361 and a second contact electrode 362 disposed on the first electrode 330 and the second electrode 340 may transmit the driving voltage and the power supply voltage to the light emitting element 350. Accordingly, a set or predetermined current may flow through the light emitting element 350, causing the light emitting element 350 to emit light.

The first insulating layer 381 is disposed on a part of each of the first electrode 330 and the second electrode 340. The first insulating layer 381 may be disposed in the space between the first electrode 330 and the second electrode 340. In a plan view, the first insulating layer 381 may have an island shape or a linear shape formed along the space between branch portions of the first electrode 330 and the second electrode 340.

The light emitting element 350 is disposed on the first insulating layer 381. The first insulating layer 381 may be disposed between the light emitting element 350 and the insulating substrate layer 310. A lower surface of the first insulating layer 381 may contact the insulating substrate layer 310, and the light emitting element 350 may be disposed on an upper surface of the first insulating layer 381. In addition, both side surfaces of the first insulating layer 381 may contact the first electrode 330 and the second electrode 340 to electrically insulate the first electrode 330 and the second electrode 340 from each other.

The first insulating layer 381 may overlap some regions of the first electrode 330 and the second electrode 340, for example, may partially overlap respective regions of the first electrode 330 and the second electrode 340 which protrude in directions facing each other. For example, both side ends of the first insulating layer 381 in cross section may cover upper surfaces of the respective regions of the first electrode 330 and the second electrode 340 which protrude in the directions facing each other. The first insulating layer 381 may protect the regions overlapping the first electrode 330 and the second electrode 340 and electrically insulate the regions from each other. In addition, the first insulating layer 381 prevents a first semiconductor layer 351 and a second semiconductor layer 352 of the light emitting element 350 from directly contacting other members (or reduces a likelihood or amount of direct contact), thereby preventing the light emitting element 350 from being damaged (or thereby reducing a likelihood or degree of such damage).

In FIG. 4, surfaces of the first insulating layer 381 which contact the first electrode 330 and the second electrode 340 are aligned with both side surfaces of the light emitting element 350. However, the present disclosure is not limited to this case. For example, the cross-sectional length of the first insulating layer 381 may be greater than the length of the light emitting element 350 so that the first insulating layer 381 protrudes from both side surfaces of the light emitting element 350. Accordingly, the side surfaces of the first insulating layer 381 and the light emitting element 350 may be stacked in a staircase pattern.

One or more light emitting elements 350 may be disposed between the first electrode 330 and the second electrode 340. Although only light emitting elements 350 emitting light of the same color are disposed in each pixel PX of the light emitting unit 300 in FIG. 2, the present disclosure is not limited to this case. Light emitting elements 350 emitting light of different colors as described above may also be disposed together in one pixel PX.

The first electrode 330 and the second electrode 340 may be spaced apart from each other by a set or predetermined distance, and the set or predetermined distance may be equal to or less than the length of the light emitting element 350. Accordingly, this may enable a smooth electrical contact between the first and second electrodes 330 and 340 and the light emitting element 350.

The light emitting element 350 may be a light emitting diode (LED). The light emitting element 350 may be a nanostructure whose size is generally in nanometers. The light emitting element 350 may be an inorganic LED made of an inorganic material. When the light emitting element 350 is an inorganic LED, if a light emitting material having an inorganic crystal structure is placed between two opposing electrodes and an electric field is formed in a set or specific direction on the light emitting material, the inorganic LED may be aligned between the two electrodes having set or specific polarities.

Referring to an enlarged view of FIG. 4, in some embodiments, the light emitting element 350 may have a structure in which the first semiconductor layer 351, an active material layer 353, the second semiconductor layer 352, and a second electrode layer 357 are stacked as will be described herein below. In the light emitting element 350, the first semiconductor layer 351, the active material layer 353, the second semiconductor layer 352, and the second electrode layer 357 may be stacked in this order in a direction parallel (e.g., substantially parallel) to the insulating substrate layer 310. In other words, the light emitting element 350 in which the above layers are stacked may be disposed in a horizontal direction parallel (e.g., substantially parallel) to the insulating substrate layer 310.

In addition, in an embodiment, the first semiconductor layer 351 of the light emitting element 350 may be electrically coupled to (e.g., electrically connected to) the second electrode 340, and the second semiconductor layer 352 or the second electrode layer 357 of the light emitting element 350 may be electrically coupled to (e.g., electrically connected to) the first electrode 330. For example, if the first electrode 330 is an anode and the second electrode 340 is a cathode, electrons may be injected into the first semiconductor layer 351 of the light emitting element 350, and holes may be injected into the second semiconductor layer 352 or the second electrode layer 357. The electrons and holes injected into the light emitting element 350 may recombine in the active material layer 353 to emit light of a set or specific wavelength band. However, the present disclosure is not limited to the above case, and the first electrode 330 and the second electrode 340 may also be the reverse of the above case. The structure of the light emitting element 350 will be described in more detail herein below.

A second insulating layer 382 may be disposed on the light emitting element 350 to protect the light emitting element 350 and to fix the light emitting element 350 between the first electrode 330 and the second electrode 340. In some embodiments, the second insulating layer 382 may also be disposed on an outer surface of the light emitting element 350 to fix the light emitting element 350. The second insulating layer 382 may be disposed on a part of the outer surface of the light emitting element 350 to expose both side surfaces of the light emitting element 350. For example, the length of the second insulating layer 382 may be smaller than that of the light emitting element 350 so that the second insulating layer 382 is recessed inwardly from the both side surfaces of the light emitting element 350. Accordingly, the side surfaces of the first insulating layer 381, the light emitting element 350 and the second insulating layer 382 may be stacked in a staircase pattern. In this case, like the first insulating layer 381, the second insulating layer 382 may enable the first contact electrode 361 and the second contact electrode 362 to smoothly contact the side surfaces of the light emitting element 350.

However, the present disclosure is not limited to this case, and the length of the second insulating layer 382 and the length of the light emitting element 350 may also be equal so that both sides of the second insulating layer 382 are aligned with both sides of the light emitting element 350. In addition, if the second insulating layer 382 is patterned at the same (e.g., substantially the same) time as the first insulating layer 381, both sides of the second insulating layer 382 may be aligned with both sides of each of the light emitting element 350 and the first insulating layer 381.

The first contact electrode 361 which is disposed on the first electrode 330 and overlaps at least a part of the second insulating layer 382 and the second contact electrode 362 which is disposed on the second electrode 340 to be spaced apart from the first contact electrode 361 and contacts at least a part of the second insulating layer 382 may be disposed on the second insulating layer 382.

The first contact electrode 361 and the second contact electrode 362 may be disposed on upper surfaces of the first electrode 330 and the second electrode 340, respectively. For example, the first contact electrode 361 and the second contact electrode 362 may be disposed on the upper surfaces of the first electrode 330 and the second electrode 340 to contact the first barrier rib electrode layer 332 and the second barrier rib electrode layer 342, respectively. The first contact electrode 361 and the second contact electrode 362 may contact the first semiconductor layer 351 and the second semiconductor layer 352 of the light emitting element 350, respectively. Accordingly, the first contact electrode 361 and the second contact electrode 362 may transmit electrical signals, which are applied to the first barrier rib electrode layer 332 and the second barrier rib electrode layer 342, to the light emitting element 350.

The first contact electrode 361 may be disposed on the first electrode 330 to cover the first electrode 330, and a lower surface of the first contact electrode 361 may partially contact the light emitting element 350 and the second insulating layer 382. An end of the first contact electrode 361 in a direction in which the second electrode 340 is located is disposed on the second insulating layer 382. The second contact electrode 362 is disposed on the second electrode 340 to cover the second electrode 340, and a lower surface of the second contact electrode 362 may partially contact the light emitting element 350, the second insulating layer 382 and a third insulating layer 383. An end of the second contact electrode 362 in a direction in which the first electrode 330 is located is disposed on the third insulating layer 383.

The first contact electrode 361 and the second contact electrode 362 may be spaced part from each other on the second insulating layer 382 or the third insulating layer 383. For example, both the first contact electrode 361 and the second contact electrode 362 may contact the light emitting element 350 and the second insulating layer 382 or the third insulating layer 383, but may be spaced apart from each other on the second insulating layer 382 without being coupled to (e.g., connected to) each other. Accordingly, the first contact electrode 361 and the second contact electrode 362 may receive different power from the first thin-film transistor 120 and the power supply wiring 161. For example, the first contact electrode 361 may receive a driving voltage applied from the first thin-film transistor 120 to the first electrode 330, and the second contact electrode 362 may receive a power supply voltage applied from the power supply wiring 161 to the second electrode 340.

The first contact electrode 361 and the second contact electrode 362 may include a conductive material such as, but not limited to, ITO, IZO, ITZO, or aluminum (Al).

In addition, the first contact electrode 361 and the second contact electrode 362 may include the same material as the first barrier rib electrode layer 332 and the second barrier rib electrode layer 342. The first contact electrode 361 and the second contact electrode 362 may be disposed on the first barrier rib electrode layer 332 and the second barrier rib electrode layer 342 in substantially the same pattern as the first barrier rib electrode layer 332 and the second barrier rib electrode layer 342 so as to contact the first barrier rib electrode layer 332 and the second barrier rib electrode layer 342. The first contact electrode 361 and the second contact electrode 362 in contact with the first barrier rib electrode layer 332 and the second barrier rib electrode layer 342 may receive electrical signals applied to the first barrier rib electrode layer 332 and the second barrier rib electrode layer 342 and transmit the received electrical signals to the light emitting element 350.

The third insulating layer 383 may be disposed on the first contact electrode 361 to electrically insulate the first contact electrode 361 and the second contact electrode 362 from each other. The third insulating layer 383 may cover the first contact electrode 361 and may not overlap a part of the light emitting element 350 so that the light emitting element 350 can be coupled to (e.g., connected to) the second contact electrode 362. On an upper surface of the second insulating layer 382, the third insulating layer 383 may partially contact the first contact electrode 361 and the second insulating layer 382. The third insulating layer 383 may cover an end of the first contact electrode 361 on the upper surface of the second insulating layer 382. Accordingly, the third insulating layer 383 may protect the first contact electrode 361 while electrically insulating the first contact electrode 361 from the second contact electrode 362.

An end of the third insulating layer 383 in the direction in which the second electrode 340 is disposed may be aligned with a side surface of the second insulating layer 382.

In some embodiments, the third insulating layer 383 may be omitted from the display device 10. Accordingly, the first contact electrode 361 and the second contact electrode 362 may be disposed in substantially the same plane and may be electrically insulated from each other by a passivation layer 385 which will be described herein below. This will be described in more detail with reference to other embodiments described herein.

The passivation layer 385 may be formed on the third insulating layer 383 and the second contact electrode 362 to protect the members disposed on the insulating substrate layer 310 from the external environment. If the first contact electrode 361 and the second contact electrode 362 are exposed, a contact electrode material can be broken due to electrode damage. Therefore, the first contact electrode 361 and the second contact electrode 362 may be covered with the passivation layer 385. For example, the passivation layer 385 may cover the first electrode 330, the second electrode 340, the light emitting element 350, etc. In addition, as described above, if the third insulating layer 383 is omitted, the passivation layer 385 may be formed on the first contact electrode 361 and the second contact electrode 362. In this case, the passivation layer 385 may electrically insulate the first contact electrode 361 and the second contact electrode 362 from each other.

Each of the first insulating layer 381, the second insulating layer 382, the third insulating layer 383, and the passivation layer 385 described above may include an inorganic insulating material. For example, the first insulating layer 381, the second insulating layer 382, the third insulating layer 383, and the passivation layer 385 may include a material such as silicon oxide (SiOx), silicon nitride (SiNx), silicon oxynitride (SiOxNy), aluminum oxide ($Al_2O_3$), or aluminum nitride (AlN). The first insulating layer 381, the second insulating layer 382, the third insulating layer 383 and the passivation layer 385 may be made of the same material or different materials. Also, various suitable materials that give an insulating property to the first insulating layer 381, the second insulating layer 382, the third insulating layer 383 and the passivation layer 385 are applicable.

As described above, the light emitting unit 300 of the display device 10 according to the embodiment may include the first electrode 330, the second electrode 340, and the light emitting element 350 disposed between the first electrode 330 and the second electrode 340. The light emitting element 350 may emit light of a set or specific wavelength band by receiving electrical signals from the first contact electrode 361 and the second contact electrode 362.

The light emitting element 350 may be manufactured on a substrate by an epitaxial growth method. For example, a seed crystal layer for forming a semiconductor layer may be formed on a substrate, and a desired semiconductor material may be deposited and grown. The structure of light emitting elements 350 according to various embodiments will now be described in more detail with reference to FIGS. 5A-5C.

Figure 5A:
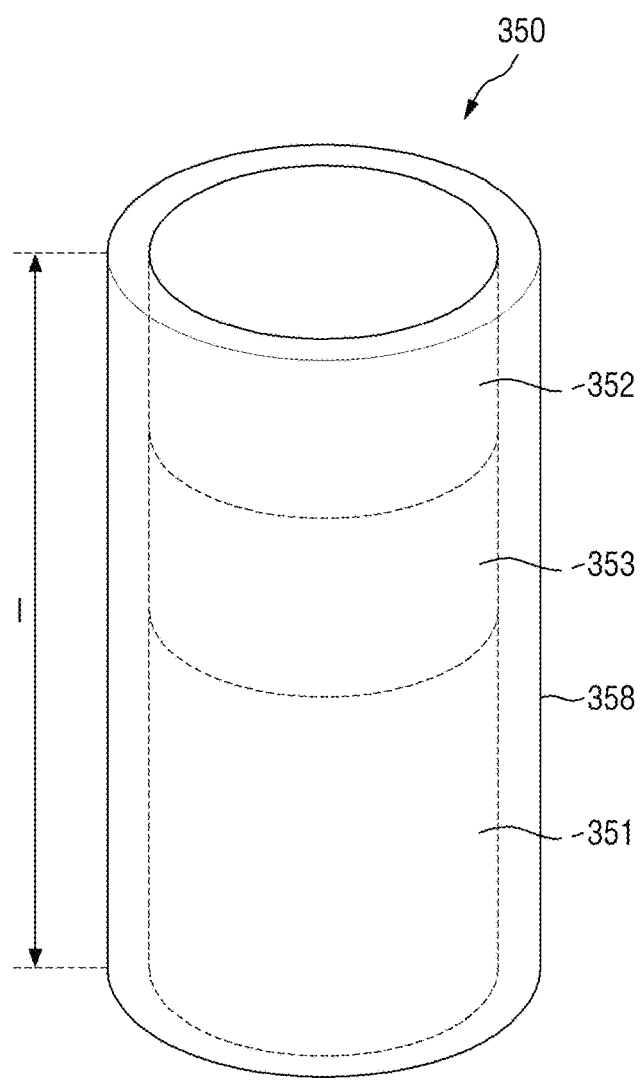
FIGS. 5A-5C are schematic views of light emitting elements according to embodiments.
Figure 5B:
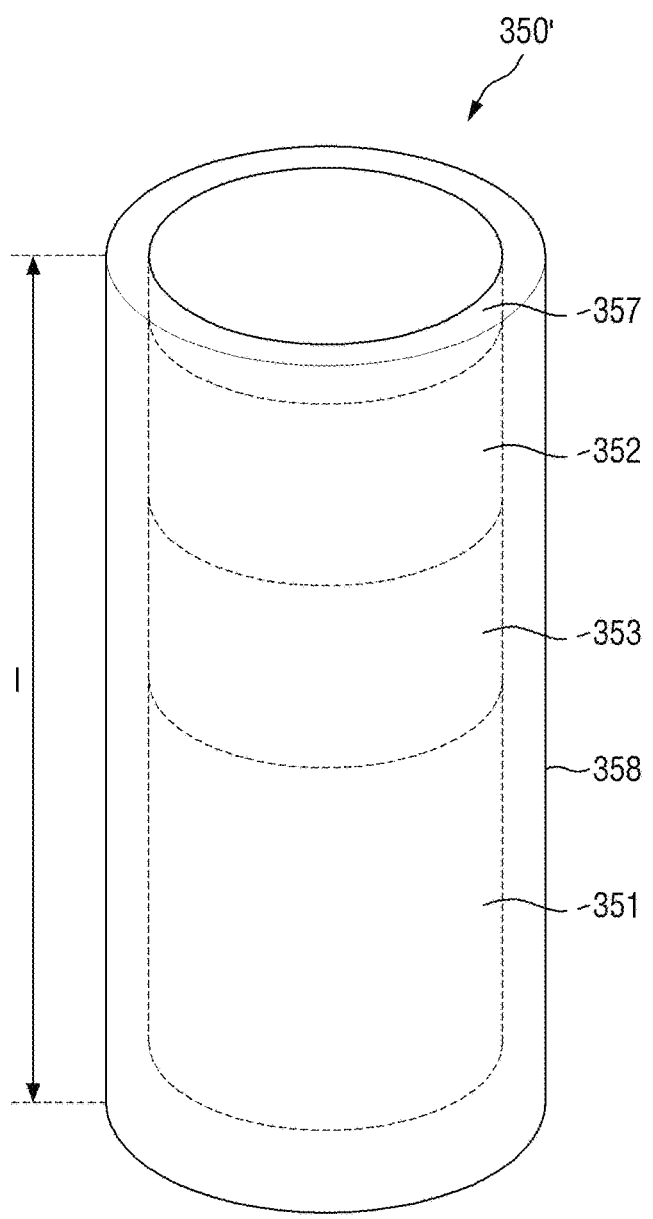
Figure 5C:
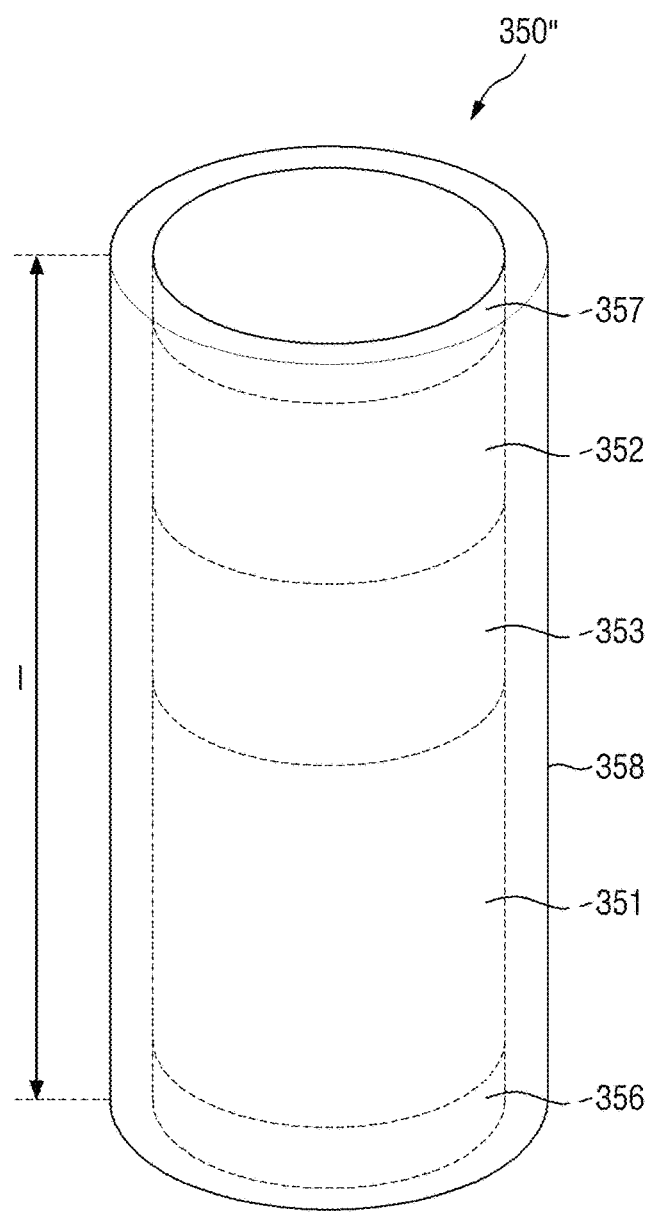

FIGS. 5A-5C are schematic views of light emitting elements according to embodiments.

Referring to FIG. 5A, a light emitting element 350 may include a plurality of semiconductor layers 351 and 352 and an active material layer 353 disposed between the semiconductor layers 351 and 352. Electrical signals applied from a first electrode 330 and a second electrode 340 may be transmitted to the active material layer 353 through the semiconductor layers 351 and 352. As a result, light may be emitted.

For example, the light emitting element 350 may include a first semiconductor layer 351, a second semiconductor layer 352, an active material layer 353 disposed between the first semiconductor layer 351 and the second semiconductor layer 352, and an insulating material layer 358. The light emitting element 350 of FIG. 5A has a structure in which the first semiconductor layer 351, the active material layer 353, and the second semiconductor layer 352 are sequentially stacked in a longitudinal direction.

The first semiconductor layer 351 may be an n-type semiconductor layer. In an example, if the light emitting element 350 emits light in a blue wavelength band, the first semiconductor layer 351 may be a semiconductor material having a chemical formula of $In_xAl_yGa_{1-x-y}N$ ($0 \le x \le 1$, $0 \le y \le 1$, $0 \le x+y \le 1$). For example, the first semiconductor layer 351 may be any one or more selected from n-type doped InAlGaN, GaN, AlGaN, InGaN, AlN and InN. The first semiconductor layer 351 may be doped with a first conductive dopant. The first conductive dopant may be, for example, Si, Ge, or Sn. The length of the first semiconductor layer 351 may be in the range of, but not limited to, about 1.5 μm to about 5 μm.

The second semiconductor layer 352 may be a p-type semiconductor layer. In an example, if the light emitting element 350 emits light in the blue wavelength band, the second semiconductor layer 352 may be a semiconductor material having a chemical formula of $In_xAl_yGa_{1-x-y}N$ ($0 \le x \le 1$, $0 \le y \le 1$, $0 \le x+y \le 1$). For example, the second semiconductor layer 352 may be any one or more selected from p-type doped InAlGaN, GaN, AlGaN, InGaN, AlN and InN. The second semiconductor layer 352 may be doped with a second conductive dopant. The second conductive dopant may be, for example, Mg, Zn, Ca, Se or Ba. The length of the second semiconductor layer 352 may be in the range of, but not limited to, about 0.08 μm to about 0.25 μm.

The active material layer 353 may be disposed between the first semiconductor layer 351 and the second semiconductor layer 352 and may include a material having a single or multiple quantum well structure. When the active material layer 353 includes a material having a multiple quantum well structure, it may have a structure in which a plurality of quantum layers and a plurality of well layers are alternately stacked. The active material layer 353 may emit light through combination of electron-hole pairs according to electrical signals received through the first semiconductor layer 351 and the second semiconductor layer 352. For example, if the active material layer 353 emits light in the blue wavelength band, it may include a material such as AlGaN or AlInGaN. For example, if the active material layer 353 has a multiple quantum well structure in which quantum layers and well layers are alternately stacked, the quantum layers may include a material such as AlGaN or AlInGaN, and the well layers may include a material such as GaN or AlGaN. However, the present disclosure is not limited to this case, and the active material layer 353 may also have a structure in which a semiconductor material having a large band gap energy and a semiconductor material having a small band gap energy are alternately stacked or may include different group 3 or 5 semiconductor materials depending on the wavelength band of emitted light. Accordingly, light emitted from the active material layer 353 is not limited to light in the blue wavelength band, but may also be light in red and green wavelength bands in some cases. The length of the active material layer 353 may be in the range of, but not limited to, about 0.05 μm to about 0.25 μm.

Light emitted from the active material layer 353 may travel not only to an outer surface of the light emitting element 350 in the longitudinal direction but also to both side surfaces. For example, the direction of the light emitted from the active material layer 353 is not limited to one direction.

The insulating material layer 358 may be formed outside the light emitting element 350 to protect the light emitting element 350. For example, the insulating material layer 358 may be formed to surround sides of the light emitting element 350 and may not be formed at both ends of the light emitting element 350 in the longitudinal direction, for example, at both ends where the first semiconductor layer 351 and the second semiconductor layer 351 are disposed. The insulating material layer 358 may include an insulating material such as silicon oxide ($SiO_x$), silicon nitride ($SiN_x$), silicon oxynitride ($SiO_xN_y$), aluminum nitride (AlN), or aluminum oxide ($Al_2O_3$). Accordingly, it is possible to prevent an electrical short circuit that may occur (or to reduce a likelihood of such an electrical short) when the active material layer 353 directly contacts the first electrode 330 or the second electrode 340. In addition, since the insulating material layer 358 protects the outer surface of the light emitting element 350 including the active material layer 353, a reduction in luminous efficiency can be prevented or reduced.

Also, in some embodiments, the insulating material layer 358 may be surface-treated so that it can be dispersed in a solution without being agglomerated with other insulating material layers 358. When the light emitting element 350 is aligned as will be described herein below, it may be aligned independently between the first electrode 330 and the second electrode 340 while being kept dispersed in the solution. For example, the surface of the insulating material layer 358 may be hydrophobic or hydrophilic-treated so that the insulating material layer 358 can be kept dispersed in the solution.

The thickness of the insulating material layer 358 may be in the range of, but not limited to, about 0.5 μm to about 1.5 μm.

The light emitting element 350 may be cylindrical. However, the shape of the light emitting element 350 is not limited to the cylindrical shape, and the light emitting element 350 may also have various suitable shapes such as a cube, a rectangular parallelepiped, and a hexagonal prism. The light emitting element 350 may have a length of about 1 μm to about 10 μm or about 2 μm to about 5 μm, for example, a length of about 4 μm. In addition, the light emitting element 350 may have a diameter of about 400 nm to about 700 nm, for example, a thickness of about 500 nm.

FIGS. 5B-5C are schematic views of light emitting elements 350' and 350" according to embodiments.

Referring to FIGS. 5B-5C, each of the light emitting elements 350' and 350" may further include an electrode layer 356 or 357 on at least any one of both side ends where a first semiconductor layer 351 and a second semiconductor layer 352 are disposed.

The light emitting element 350' of FIG. 5B may further include an electrode layer 357 only on the second semiconductor layer 352. The light emitting element 350" of FIG. 5C may further include electrode layers 356 and 357 on the first semiconductor layer 351 and the second semiconductor layer 352, respectively. For ease of description, an electrode layer formed at an end where the first semiconductor layer 351 is disposed will be referred to as a first electrode layer 356, and an electrode layer formed on the other end where the second semiconductor layer 352 is disposed will be referred to as a second electrode layer 357. However, the present disclosure is not limited to this case, and any suitable electrode layer can be referred to as the first electrode layer.

Each of the light emitting elements 350' and 350" according to the embodiments may include at least any one of the first electrode layer 356 and the second electrode layer 357. In this case, an insulating material layer 358 may extend in the longitudinal direction to cover the first electrode layer 356 and the second electrode layer 357. However, the present disclosure is not limited to this case, and the insulating material layer 358 may cover only the first semiconductor layer 351, an active material layer 353 and the second semiconductor layer 352 or may cover only a part of an outer surface of each of the first and second electrode layers 356 and 357 to expose a part of the outer surface of each of the first electrode layer 356 and the second electrode layer 357.

The first electrode layer 356 and the second electrode layer 357 may be ohmic contact electrodes. However, the first electrode layer 356 and the second electrode layer 357 are not limited to ohmic contact electrodes and may also be Schottky contact electrodes. The first electrode layer 356 and the second electrode layer 357 may include a conductive metal. For example, the first electrode layer 356 and the second electrode layer 357 may include at least any one selected from aluminum (Al), titanium (Ti), indium (In), gold (Au), and silver (Ag). The first electrode layer 356 and the second electrode layer 357 may include the same material or different materials.

Referring again to FIG. 1, the display device 10 may include the color conversion unit 500. The color conversion unit 500 may include the color conversion layers 520, each converting light of a set or specific wavelength band received from the light emitting elements 350 of each light emitting unit 300 into light of another wavelength band. According to an embodiment, each of the color conversion layers 520 may include two different kinds of color conversion particles 530, for example, first color conversion particles 531 for converting light of a set or specific wavelength band into the red light L1 and second color conversion particles 532 for converting the light into the green light L2. The color conversion unit 500 will now be described in more detail.

Referring to FIG. 1, the color conversion unit 500 according to an embodiment may include the color conversion layers 520, the color filter layers 550, light shielding members BM, and an upper substrate 510.

The color conversion layers 520 of the color conversion unit 500 may be disposed on the light emitting units 300. The color conversion layers 520 may overlap some regions of the light emitting units 300, for example, the outer barrier ribs 420. In the cross section of the display device 10, some regions of the color conversion unit 500 and the light emitting units 300 are illustrated. Although some regions of the light emitting units 300 are omitted in the drawing, they are the same as those described above with reference to FIG. 2.

The color conversion layers 520 may contact members disposed in the light emitting units 300, for example, the first electrodes 330, the second electrodes 340, the light emitting elements 350, etc. For example, the color conversion layers 520 may substantially cover the members. However, since each of the light emitting units 300 includes the passivation layer 385 for protecting the members as described above, the color conversion layers 520 may not physically contact the light emitting elements 350 directly.

Each of the color conversion layers 520 may be separated from adjacent color conversion layers 520 by the outer barrier ribs 420 disposed to separate the light emitting units 300. In some embodiments, the color conversion layers 520 may include a first color conversion layer 521, a second color conversion layer 522 and a third color conversion layer 523 and may respectively be disposed in regions overlapping the pixels PX of the light emitting units 300.

Since a plurality of color conversion layers 520, for example, the first color conversion layer 521, the second color conversion layer 522 and the third color conversion layer 523 include the same color conversion particles 530 as will be described herein below, they may also not be separated by the outer barrier ribs 420. In addition, according to an embodiment, the color conversion unit 500 of the display device 10 may be manufactured in a separate process from the light emitting units 300 and then attached to the light emitting units 300. In this case, a plurality of members may be further provided between the color conversion unit 500 and the light emitting units 300, and the color conversion layers 520 may not contact the members disposed on the light emitting units 300. This will be described in more detail herein with reference to other embodiments.

The color conversion layers 520 may include one or more color conversion particles 530. The color conversion particles 530 may convert first light L of an arbitrary wavelength band incident from the light emitting units 300 into second light L' of a wavelength band different from that of the first light L. In some embodiments, when the blue light L3 emitted from the light emitting elements 350 of each light emitting unit 300 is incident on a color conversion layer 520, the color conversion particles 530 of the color conversion layer 520 may convert the blue light L3 into the red light L1 or the green light L2. Accordingly, even if the light emitting elements 350 emit light of the same color, the light may be converted into light of various suitable colors by the color conversion layers 520. The light converted by the color conversion layers 520 may be incident on the color filter layers 550 and finally displayed on the pixels PX of the display device 10.

In an embodiment, the color conversion particles 530 may be a quantum dot material or a phosphor material.

If the color conversion particles 530 are a quantum dot material, when the first light L having an arbitrary wavelength band is incident on the quantum dot material, valence band electrons of the quantum dot material are excited to a conduction band. As the excited electrons transit back to the valence band, the second light L' having the converted wavelength band may be emitted.

The quantum dot material may have a spherical core-shell structure. The core may be a semiconductor nanocrystalline material. For example, the core of the quantum dot material may be silicon (Si) nanocrystals, group II-VI compound nanocrystals, or group III-V compound nanocrystals. For example, the quantum dot material may include a core made of any one selected from cadmium selenide (CdSe), cadmium telluride (CdTe), cadmium sulfide (CdS) and indium phosphide (InP) and a shell made of zinc sulfide (ZnS).

When the color conversion particles 530 are a quantum dot material, the wavelength of emitted light may be controlled by adjusting the particle size of the quantum dot material. For example, the particle size of the quantum dot material may be about 55 Å to about 65 Å in diameter. In this case, red light may be emitted when blue light is incident. In addition, if the particle size of the quantum dot material is about 40 Å to about 50 Å, green light may be emitted when blue light is incident.

The color conversion particles 530 may not necessarily be a spherical quantum dot material. In some cases, the color conversion particles 530 are not particularly limited as long as they are a material capable of converting incident light of a set or specific wavelength band into light of another wavelength band, such as a phosphor material, a plate-like material, a bar-like or rod-like material, or a perovskite quantum dot material. A case where the color conversion particles 530 are a spherical quantum dot material will be described below as an example.

In addition, in an exemplary embodiment, the color conversion particles 530 may include the first color conversion particles 531 for converting the first light L of an arbitrary wavelength band into the second light L' of another wavelength band and second color conversion particles 532 for converting the first light L into third light L'' of another wavelength band. For example, the color conversion particles 530 may include the first color conversion particle 531 for converting the blue light L3 into the red light L1 and the second color conversion particles 531 for converting the blue light L3 into the green light L2.

In some embodiments, the light emitting units 300 of the display device 10 according to the embodiment include the light emitting elements 350 that emit light of the same color, for example, the blue light L3. A portion of the blue light L3 incident on each color conversion layer 520 is incident on the first color conversion particles 531, and another portion of the blue light L3 is incident on the second color conversion particles 532. The first color conversion particles 531 and the second color conversion particles 532 may convert the incident light into the red light L1 and the green light L2, respectively. In addition, of the blue light L3 incident on each color conversion layer 520, light not incident on the color conversion particles 530 may pass through each color conversion layer 520 as it is. For example, the color conversion layers 520 may substantially provide the red light L1, the green light L2, and the blue light L3 to the color filter layers 550. The color filter layers 550 may substantially receive white light which is a mixture of the red light L1, the green light L2 and the blue light L3.

Each of the first color conversion layer 521, the second color conversion layer 522 and the third color conversion layer 523 may include the first color conversion particles 531 and the second color conversion particles 532. Therefore, the first color conversion layer 521, the second color conversion layer 522 and the third color conversion layer 523 disposed in the color conversion unit 500 may be substantially the same layer. However, as will be described herein below, different color filter layers 550 may be disposed on the first color conversion layer 521, the second color conversion layer 522 and the third color conversion layer 523. Therefore, light provided to the color filter layers 550 may be displayed in different colors on the pixels PX of the display device 10. This will be described in more detail herein below.

The color conversion particles 530 may be dispersed in a light transmitting resin R. The light transmitting resin R is not particularly limited as long as it is a material that does not absorb light incident on the color conversion layers 520 and does not affect the light absorption and emission of the color conversion particles 530. For example, the light transmitting resin R may include an organic material such as epoxy resin or acrylic resin.

The color conversion particles 530 of the color conversion layers 520 may be dispersed on the light emitting units 300. The color conversion particles 530 dispersed in the color conversion layers 520 may be disposed adjacent to the light emitting elements 350. In some embodiments, at least some of the color conversion particles 530 may be disposed on the light emitting elements 350, and the other color conversion particles 530 may be disposed on sides of the light emitting elements 350. In other words, the color conversion particles 530 may be disposed not only on the light emitting elements 350 in the drawing, but also on the side surfaces of the light emitting elements 350 in the drawing. For example, at least some of the color conversion particles 530 may be disposed between the light emitting elements 350 and the inner barrier ribs 410 and between the inner barrier ribs 410 and the outer barrier ribs 420. In some embodiments, if a plurality of light emitting elements 350 are disposed between the first electrode 330 and the second electrode 340, some of the color conversion particles 530 may also be disposed between regions in which the light emitting elements 350 are aligned.

Of the light emitted from the light emitting elements 350, light reflected by the barrier rib reflective layers 331 and 341 on the inner barrier ribs 410 may be incident on the color conversion particles 530 dispersed on the light emitting elements 350. In addition, of the light emitted from the light emitting elements 350, light leaked without being reflected by the barrier rib reflective layers 331 and 341 on the inner barrier ribs 410 may be incident on the color conversion particles 530 dispersed between the inner barrier ribs 410 and the outer barrier ribs 420 or between the light emitting elements 350, for example, on the sides of the light emitting elements 350. The light may be reflected by the outer barrier ribs 420 to the color filter layers 550 which will be described herein below.

Accordingly, the color conversion particles 530 may be dispersed adjacent to the light emitting elements 350, so that most of the light emitted from the light emitting elements 350 can be incident on the color conversion particles 530. For example, the light efficiency can be improved by increasing the ratio of the light incident on the color conversion particles 530 to the light emitted from the light emitting elements 350.

The color conversion layers 520 may be formed using various suitable processes such as, but not limited to, inkjet injection or photoresist (PR).

When light having an arbitrary wavelength band is incident on the color conversion particles 530 and then emitted after its wavelength is converted, the emitting direction of the converted light has a random scattering characteristic (Lambertian emission). Accordingly, the color conversion layers 520 including the color conversion particles 530 may emit light having uniform (or substantially uniform) front and side luminance even if they do not include a scatterer. However, the color conversion layers 520 may further include a scatterer (not illustrated) in order to increase light conversion efficiency. The scatterer is not particularly limited as long as it is a material capable of uniformly (or substantially uniformly) scattering light. For example, the scatterer may be nanoparticles such as $SiO_2$, $TiO_2$, $ZrO_2$, $Al_2O_3$, $In_2O_3$, ZnO, $SnO_2$, $Sb_2O_3$ or ITO. In addition, in some embodiments, the color conversion layers 520 may include only a scattering agent instead of the color conversion particles 530. For example, when light incident from the light emitting units 300 to the color conversion layers 520 can be emitted without being converted by the color conversion particles 530, the color conversion layers 520 may include only a scattering agent.

In some embodiments, the third color conversion layer 523 may not include the color conversion particles 530 and may include only a scattering agent (not illustrated). In this case, the first color conversion layer 521 and the second color conversion layer 522 may include the first color conversion particles 531 and the second color conversion particles 532, and the third color conversion layer 533 may include a scattering agent. Accordingly, a mixture of the red light L1, the green light L2 and the blue light L3 may be incident on some of the color filter layers 550 which will be described herein below, but only the blue light L3 may be incident on the other color filter layer 550.

The color filter layers 550 may be disposed on the color conversion layers 520. Light emitted from the light emitting units 300 may be incident on the color conversion layers 520, and the light converted to other colors by the color conversion layers 520 may be incident on the color filter layers 550. Each of the color filter layers 550 may block transmission of a portion of light incident from a color conversion layer 520 and transmit the other portion of the light to the outside of the display device 10.

In other words, each of the color filter layers 550 may include a transparent organic film and may function as a color light-transmitting layer that transmits incident light as it is. In addition, each of the color filter layers 550 may be a color filter or a wavelength-selective optical filter that transmits first light of a certain wavelength band but blocks or reflects second light, third light, etc. of other wavelength bands.

When each of the color filter layers 550 functions as a color light-transmitting layer, it may include a colorant having a color of an arbitrary wavelength band in order to enhance the purity of a transmitted color. The colorant may be dispersed in the transparent organic film of each of the color filter layers 550, but the present disclosure is not limited to this case.

For example, the color filter layers 550 may include a first color filter layer 551, a second color filter layer 552, and a third color filter layer 553. The color filter layers 550 may be disposed on the first color conversion layer 521, the second color conversion layer 522, and the third color conversion layer 523, respectively. For example, the first color filter layer 551, the second color filter layer 552, and the third color filter layer 553 are disposed in regions in which the pixels PX and the color conversion unit 500 overlap each other, respectively.

The first color filter layer 551 may receive light from the first color conversion layer 521. The second color filter layer 552 may receive light from the second color conversion layer 522, and the third color filter layer 553 may receive light from the third color conversion layer 523. Here, since each of the color conversion layers 520 includes the first color conversion particles 531 and the second color conversion particles 532 as described above, the red light L1, the green light L2 and the blue light L3 or a mixture (i.e., white light) of the red light L1, the green light L2 and the blue light L3 may be incident on each of the first color filter layer 551, the second color filter layer 552, and the third color filter layer 553.

The color filter layers 550 receiving the above light from the color conversion layers 520 may selectively transmit or block some of the light. Accordingly, the pixels PX of the display device 10 may display different colors, respectively.

For example, of the light incident from the first color conversion layer 521, the first color filter layer 551 may transmit the red light L1 as it and block the green light L2 and the blue light L3. Of the light incident from the second color conversion layer 522, the second color filter layer 552 may transmit the green light L2 as it is and block the red light L1 and the blue light L3. Of the light incident from the third color conversion layer 523, the third color filter layer 553 may transmit the blue light L3 as it is and block the red light L1 and the green light L2. When a color conversion layer 520, for example, the third color conversion layer 523 includes only a scattering agent as described above, only the blue light L3 may be incident on the third color filter layer 553.

Accordingly, even if light of one or more colors, for example, the red light L1, the green light L2 and the blue light L3 or a mixture of the red light L1, the green light L2 and the blue light L3 are incident on each of the first color filter layer 551, the second color filter layer 552 and the third color filter layer 553, the first color filter layer 551, the second color filter layer 552 and the third color filter layer 553 may respectively emit only the red light L1, the green light L2 and the blue light L3 to the outside of the display device 10. Therefore, the first pixel PX1, the second pixel PX2 and the third pixel PX3 of the display device 10 may display the red light L1, the green light L2 and the blue light L3, respectively.

The upper substrate 510 having the light shielding members BM is disposed on the color filter layers 550. As illustrated in FIG. 1, the upper substrate 510 may display light, which is received from the light emitting units 300 disposed under the upper substrate 510, on the outside of the display device 10.

The upper substrate 510 may be a transparent insulating substrate. For example, the upper substrate 510 may include a glass material, a quartz material, or a light-transmitting plastic material. The upper substrate 510 may cover all of the light emitting units 300 and the color conversion unit 500 of the display device 10. Accordingly, the upper substrate 510 may protect the above members while displaying light of a set or specific wavelength band by including a transparent material.

The light shielding members BM are disposed on the upper substrate 510 and spaced apart from each other. The light shielding members BM spaced apart from each other may be arranged in a set or predetermined pattern. For example, the light shielding members BM may be arranged in a lattice pattern surrounding the color filter layers 550.

The light shielding members BM may be regions where transmission of light provided by the light emitting units 300 is substantially blocked. Accordingly, the light shielding members BM can prevent or reduce color mixture of light emitted from the color conversion unit 500, thereby improving color reproducibility.

The light shielding members BM may include a material having a high rate of absorption of visible light. For example, the light shielding members BM may include a metal such as chromium, a metal nitride, a metal oxide, or a resin material colored in black.

As described above, in the display device 10 according to the embodiment, the light emitting elements 350 that emit the blue light L3 may be disposed in the light emitting units 300, and each color conversion layer 520 may include both the first color conversion particles 531 and the second color conversion particles 532. Accordingly, light of the same color may be incident on each color filter layer 550, and light of different colors may respectively be emitted from the pixels PX by different color filter layers 550. Since the same color conversion particles 530 are included in each color conversion layer 520, the number of processes that are repeatedly performed can be reduced.

Therefore, since the light emitting units 300 and the color conversion unit 500 can be respectively manufactured using only the light emitting elements 350 of the same type (or kind) and the color conversion particles 530 of the same type (or kind) during the manufacture of the display device 10, the processes that are performed repeatedly can be simplified. In addition, even if an ink assigned to each light emitting unit 300 overflows to a neighboring light emitting unit 300, there is no concern about color mixing. Therefore, a defect rate can be reduced, and the mass-productivity of the display device 10 can be improved. Furthermore, since the green light L2 with low light efficiency due to material characteristics is emitted by converting the blue light L3 into the green light L2, the light efficiency can be improved.

Also, according to some embodiments, in order to further improve the light efficiency of the green light L2, the second color conversion particles 532 may be contained in the second color conversion layer 522 at a higher density than in the first color conversion layer 521 or the third color conversion layer 523.

More second color conversion particles 532 may be contained in the second color conversion layer 522 in order to increase the ratio of light converted into the green light L2 to the blue light L3 incident on the second color conversion layer 522. As the content of the second color conversion particles 532 increases, more blue light L3 can be absorbed, and more green light L2 can be emitted. For example, when the second color conversion layer 522 includes more second color conversion particles 532 than the third color conversion layer 523, the amount of the green light L2 incident on the second color filter layer 552 may be greater than the amount of the green light L2 incident on the third color filter layer 553. Even if the light emitting elements 350 emitting light of the same blue light L3 are used, the amount of the green light L2 emitted can be controlled according to the content of the second color conversion particles 532. Accordingly, even when a mixture of the blue light L3 and the green light L2 is incident on the second color filter layer 552, only pure green light L2 can be emitted, so a change in color coordinates can be minimized or reduced.

A method of manufacturing a display device 10 according to an embodiment will now be described with reference to FIGS. 6-17. FIGS. 6-12 are cross-sectional views schematically illustrating a method of manufacturing a light emitting unit 300, and FIGS. 13-17 are cross-sectional views schematically illustrating a method of manufacturing a color conversion unit 500.

The method of manufacturing the light emitting unit 300 will first be described with reference to FIGS. 6-12. Although the method of manufacturing the light emitting unit 300 overlapping one pixel PX is schematically illustrated in the drawings, the same is true for light emitting units 300 overlapping other pixels PX.

The method of manufacturing the display device 10 according to the embodiment includes forming outer barrier ribs 420, which are spaced apart from each other, on an insulating substrate layer 310 and forming first and second inner barrier ribs 411 and 412, which are spaced apart from each other, between the outer barrier ribs 420.

Figure 6:
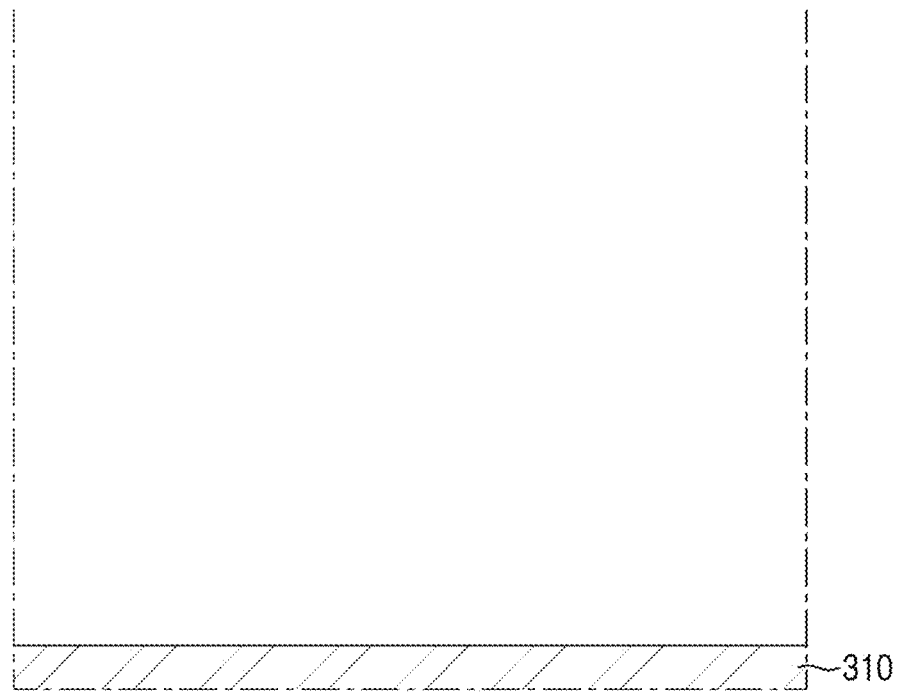
FIGS. 6-12 are cross-sectional views schematically illustrating a method of manufacturing a light emitting unit according to an embodiment.

For example, referring to FIG. 6, the insulating substrate layer 310 on which a plurality of members of the light emitting unit 300 are disposed is prepared. In some embodiments, thin-film transistors described above may be disposed under the insulating substrate layer 310.

Figure 7:
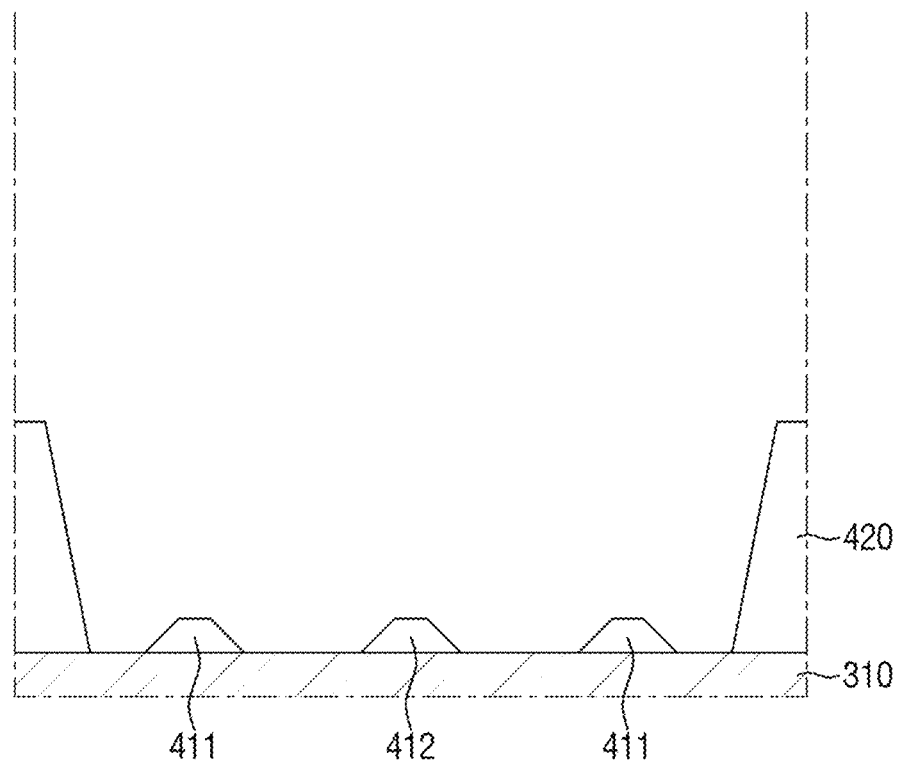

Next, referring to FIG. 7, the outer barrier ribs 420 spaced apart from each other and the first and second inner barrier ribs 411 and 412 disposed between the outer barrier ribs 420 are formed on the insulating substrate layer 310. The forming of the outer barrier ribs 420 and the inner barrier ribs 410 may be performed by any suitable mask process available in the art.

As described above, the outer barrier ribs 420 and the inner barrier ribs 410 may include substantially the same material. Therefore, although the outer barrier ribs 420 and the inner barrier ribs 410 are illustrated as being spaced apart from each other in the drawing, they may form substantially one lattice pattern. During the mask process, patterning may be performed using a slit mask or a halftone mask such that the outer barrier ribs 420 and the inner barrier ribs 410 can be distinguished from each other. Accordingly, as illustrated in FIG. 7, the outer barrier ribs 420 may be higher than the inner barrier ribs 410. However, the present disclosure is not limited to this case, and patterning may also be performed to form barrier ribs having the same (e.g., substantially the same) structure, and then an additional mask process may be performed on some of the barrier ribs to form the outer barrier ribs 420.

Figure 8:
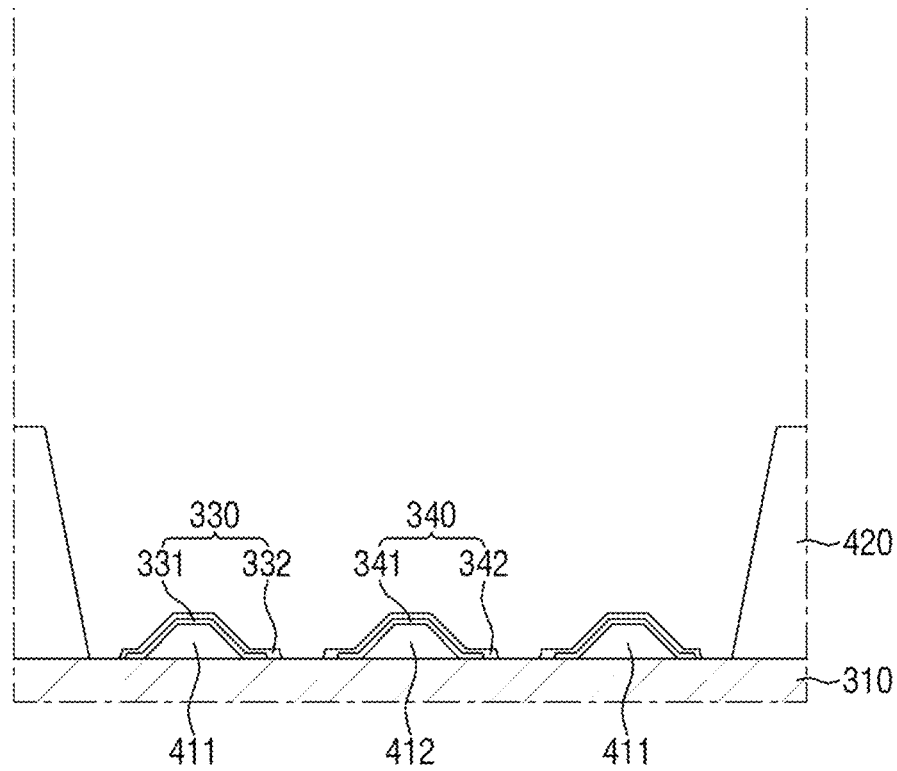

Next, referring to FIG. 8, first electrodes 330 are formed on the first inner barrier ribs 411, and a second electrode 340 is formed on the second inner barrier rib 412. In addition, a first insulating layer 381 is formed to cover at least a part of each of the first and second electrodes 330 and 340.

The first electrodes 330 and the second electrode 340 are disposed on upper surfaces of the first inner barrier ribs 411 and the second inner barrier rib 412, respectively. At least a part of each of the first and second electrodes 330 and 340 may have substantially the same shape as a corresponding inner barrier rib 410. However, each of the first and second electrodes 330 and 340 may extend further than both ends of the corresponding inner barrier rib 410. Accordingly, the extended regions of the first and second electrodes 330 and 340 may contact an upper surface of the insulating substrate layer 310.

Each first electrode 330 and the second electrode 340 may be protected by the first insulating layer 381 and may be spaced apart from each other so as to be electrically insulated from each other. The first electrodes 330 and the second electrode 340 may be formed together in the same mask process. However, the present disclosure is not limited to this case, and the first electrodes 330 and the second electrode 340 may also be patterned separately by different mask processes.

The first insulating layer 381 is patterned such that it is disposed between each first electrode 330 and the second electrode 340. The first insulating layer 381 may be disposed in a region between each first electrode 330 and the second electrode 340 and protect respective facing ends of the first and second electrodes 330 and 340. In addition, in some embodiments, the first insulating layer 381 may cover a part of each of the outer barrier ribs 420. When the first insulating layer 381 is formed, a patterning process may be performed such that the first insulating layer 381 is disposed in some regions. Accordingly, if the first insulating layer 381 is patterned to cover the outer barrier ribs 420, it may be disposed on the outer barrier ribs 420. However, the present disclosure is not limited to this case.

The first electrodes 330 and the second electrode 340 may be electrically coupled to (e.g., electrically connected to) the thin-film transistors disposed under the insulating substrate layer 310 through contact holes. The method of realizing electrical coupling (e.g., electrical connection) by forming contact holes may be a method within the range that can be generally employed and is not particularly limited as long as it can bring about a similar effect to that of the generally employed method. Since this has been described above, redundant description thereof will not be repeated here.

Next, a light emitting element 350 is aligned on the first insulating layer 381 between each first electrode 330 and the second electrode 340. The light emitting element 350 may be aligned using DEP. This will be described in more detail with reference to FIGS. 9-11.

Figure 9:
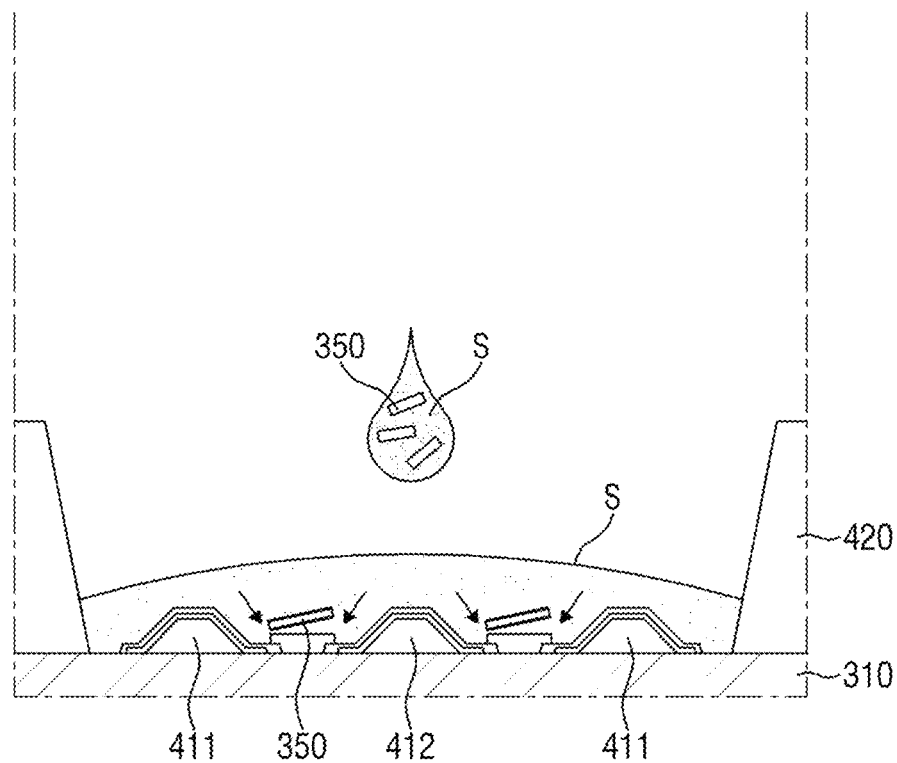

First, referring to FIG. 9, a light emitting element solution S containing a plurality of light emitting elements 350 is injected between outer barrier ribs 420 of the insulating substrate layer 310 so that the light emitting elements 350 are placed on the first electrodes 330 and the second electrode 340. The light emitting element solution S may be in the form of ink or paste and may be any one or more selected from acetone, water, alcohol, and toluene. However, the light emitting element solution S is not limited to the above examples and is not particularly limited as long as it is a material that can be vaporized at room temperature or by heat.

The light emitting element solution S may maintain a hemispherical shape between the outer barrier ribs 420 due to surface tension. For example, in regions of the light emitting element solution S in contact with the outer barrier ribs 420, a force acts in a direction toward the center of the light emitting element solution S. Thus, the light emitting element solution S may not flow over the outer barrier ribs 420. Accordingly, once the light emitting elements 350 are placed, they can be prevented from moving to other adjacent light emitting units 300 (or a likelihood or amount of such movement can be reduced).

Here, the same light emitting elements 350, for example, light emitting elements 350 emitting blue light L3 may be placed between the outer barrier ribs 420 on the insulating substrate layer 310. Accordingly, the number of the same processes repeated to manufacture the light emitting unit 300 can be reduced, thereby increasing the yield. Further, the defect rate of the light emitting unit 300 can be reduced as compared with when light emitting elements 350 emitting light of different colors are used.

However, in some embodiments, the light emitting element solution S may also be applied to the entire region (or substantially the entire region) on the insulating substrate layer 310. In this case, the light emitting element solution S may move to other adjacent light emitting units 300 beyond the outer barrier ribs 420. Since all light emitting units 300 respectively overlapping the pixels PX may include the same light emitting elements 350, the light emitting element solution S can be applied to the entire region (or substantially the entire region) instead of being individually injected into each light emitting unit 300.

Next, after the light emitting elements 350 are placed, they are aligned using DEP.

Figure 10:
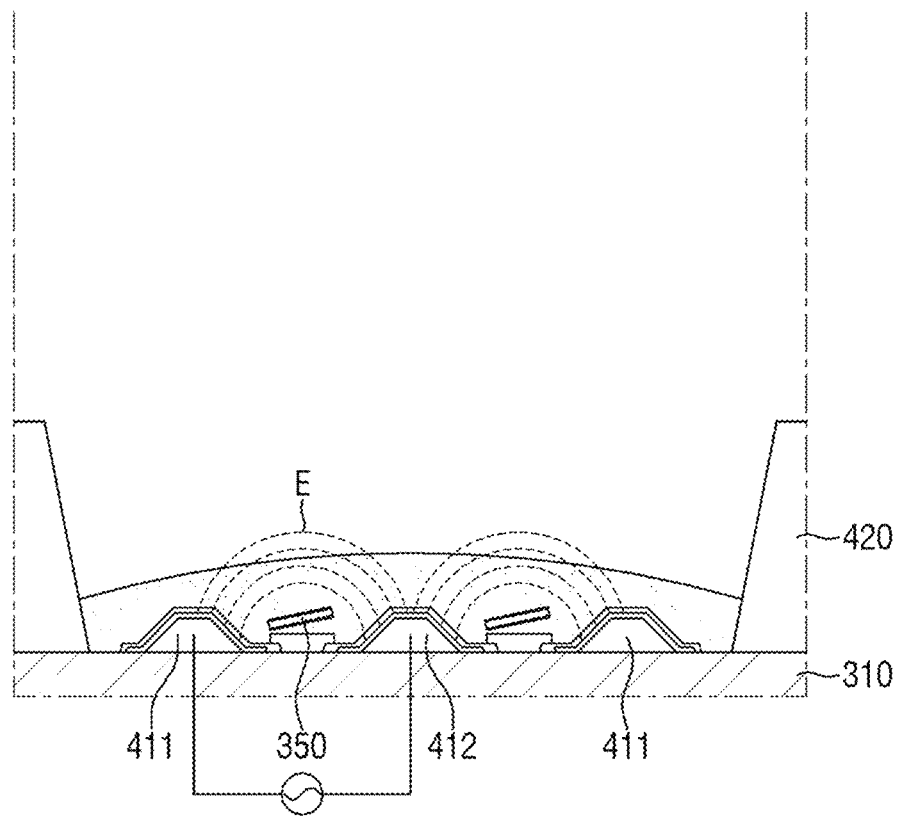

Referring to FIG. 10, power V is applied to the first electrodes 330 and the second electrode 340 so as to form an electric field E between each first electrode 330 and the second electrode 340. The power V may be an external power source or an internal power source of the display device 10. The power V may be AC or DC power having a set or predetermined amplitude and period. The DC power may be repeatedly applied to the first electrodes 330 and the second electrode 340 so as to realize power having a set or predetermined amplitude and period.

When the power V is applied to each first electrode 330 and the second electrode 340, the electric field E is formed by a potential difference generated due to electric polarities given to the first and second electrodes 330 and 340. Bipolarity is induced in the light emitting element 350 under the non-uniform electric field E, and the light emitting element 350 is driven by a dielectrophoretic force toward a side of the electric field E which has a larger or smaller slope. The light emitting element 350 may be self-aligned between each first electrode 330 and the second electrode 340 by the dielectrophoretic force.

Figure 11:
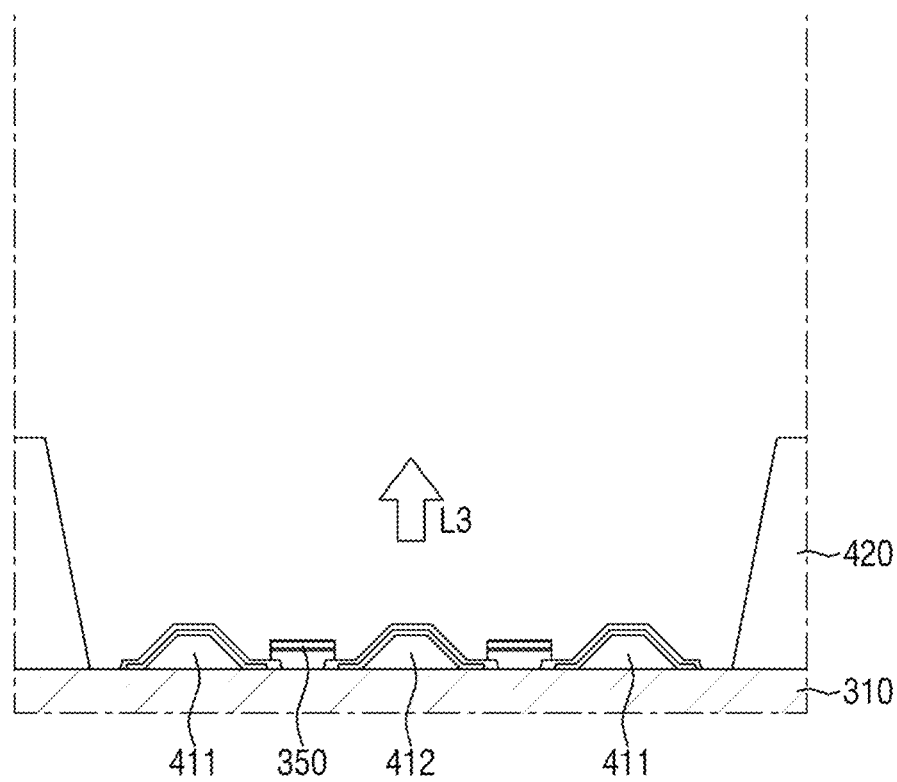

Next, referring to FIG. 11, after the alignment of the light emitting elements 350, the light emitting element solution S is vaporized and removed at room temperature or by heat. The light emitting elements 350 of the light emitting unit 300 may emit light of the same color, for example, the blue light L3. As described above, the light emitting elements 350 may be aligned together in one process.

Figure 12:
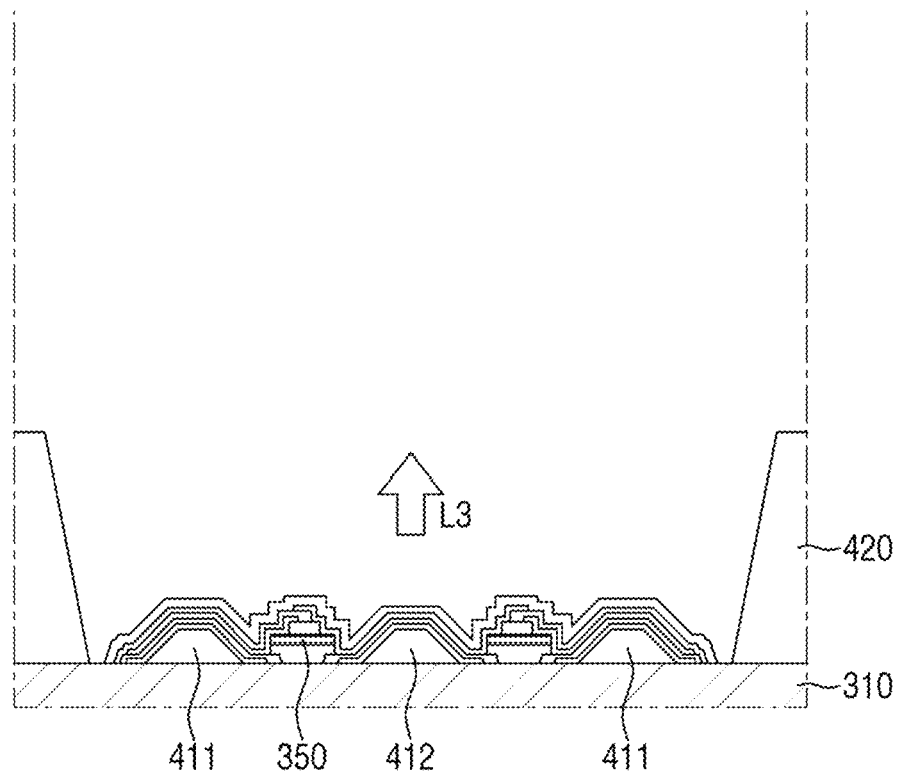

Next, referring to FIG. 12, a second insulating layer 382 is formed on each of the light emitting elements 350, a first contact electrode 361 and a second contact electrode 362 are formed on each first electrode 330 and the second electrode 340, and a third insulating layer 383 and a passivation layer 385 are formed on the first contact electrode 361 and the second contact electrode 362. The above members may be formed by a mask process as in the method of forming the members such as the first electrodes 330, the second electrode 340, and the first insulating layer 381. Thus, a redundant description of this process will not be repeated here.

Through the above-described method, the light emitting unit 300 in which the light emitting elements 350 emitting light of the same color are disposed can be manufactured.

Next, the method of manufacturing the color conversion unit 500 will be described with reference to FIGS. 13-17.

Figure 13:
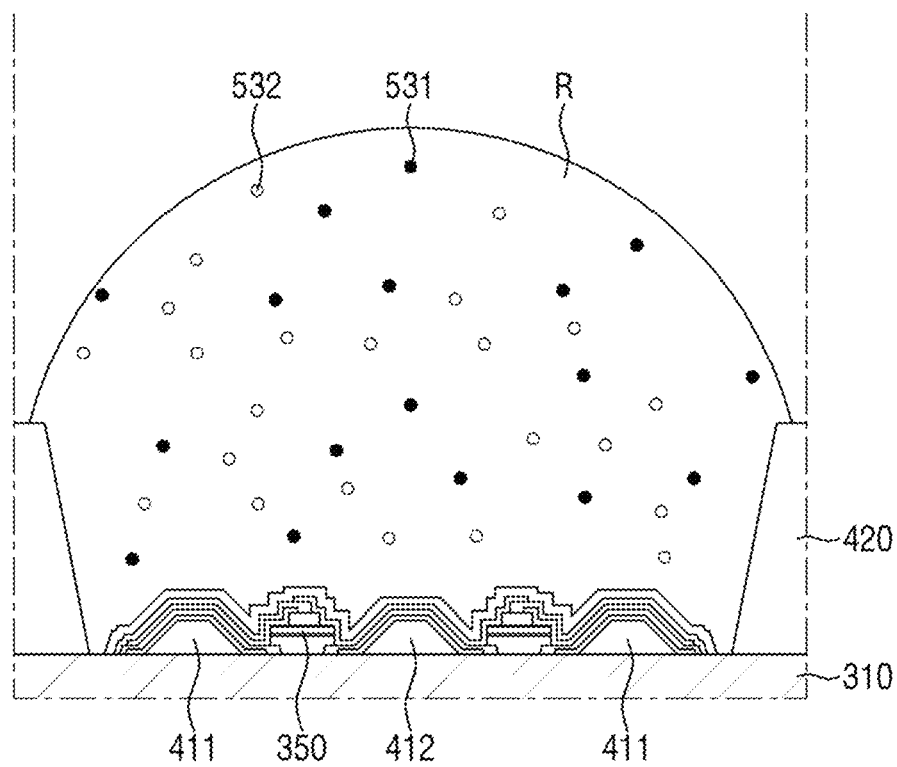
FIGS. 13-17 are cross-sectional views schematically illustrating a method of manufacturing a color conversion unit according to an embodiment.
Figure 14:
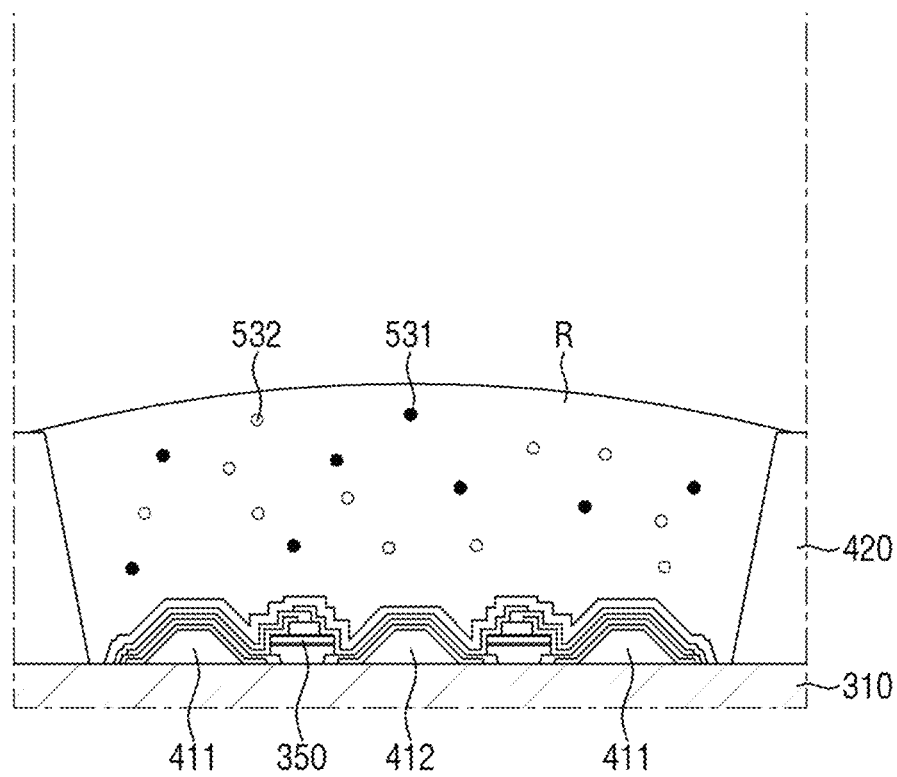

First, referring to FIGS. 13-14, a light transmitting resin R containing color conversion particles 530 is injected onto each light emitting unit 300. Then, the light transmitting resin R is dried and cured to form a color conversion layer 520.

The color conversion layer 520 of the color conversion unit 500 may be formed directly on each light emitting unit 300. The light transmitting resin R is not particularly limited as long as it does not cause damage to the light emitting elements 350 or the passivation layer 385 by reacting with the light emitting elements 350 or the passivation layer 385. In an exemplary embodiment, the light transmitting resin R in which the color conversion particles 530 are dispersed may include an organic material such as epoxy resin or acrylic resin.

The color conversion particles 530 may include first color conversion particles 531 and second color conversion particles 532. The first color conversion particles 531 may convert the blue light L3 emitted from the light emitting elements 350 into red light L1, and the second color conversion particles 532 may convert the blue light L3 into green light L2. This has been described in more detail herein above.

A first color conversion layer 521, a second color conversion layer 522, and a third color conversion layer 523 may be formed on the light emitting units 300, respectively. As described above, the first color conversion particles 531 and the second color conversion particles 532 may be, but are not limited to, a quantum dot material or a rod-like material. In addition, since all of the first color conversion layer 521, the second color conversion layer 522 and the third color conversion layer 523 include the first color conversion particles 531 and the second color conversion particles 532, they may be substantially the same layer.

In FIG. 13, the light transmitting resin R injected onto each light emitting unit 300 forms interfaces on the outer barrier ribs 420. Accordingly, the light transmitting resin R may not overflow to adjacent light emitting units 300 beyond the outer barrier ribs 420. However, since the light transmitting resins R include the same color conversion particles 530, for example, the first color conversion particles 531 and the second color conversion particles 532, they can also be mixed in different light emitting units 300. For example, the light transmitting resin R may be injected into the entire region (or substantially the entire region) on the light emitting units 300 regardless of regions separated by the outer barrier ribs 420. Accordingly, it is possible to form the color conversion layers 521 through 523 by performing one process without the need to repeatedly perform the same process three times.

Referring to FIG. 14, a plurality of color conversion layers 520 are formed by curing the light transmitting resin R. In some embodiments, the color conversion layers 520 disposed on the light emitting units 300 may function as a filler when an upper substrate 510 which will be described herein below is bonded. In addition, upper surfaces of the color conversion layers 520 may be substantially planarized to minimize or reduce steps (e.g., surface defects).

Next, color filter layers 550 and the upper substrate 510, which are placed on the color conversion layers 520, are prepared and bonded to the light emitting units 300 having the color conversion layers 520.

Figure 15:
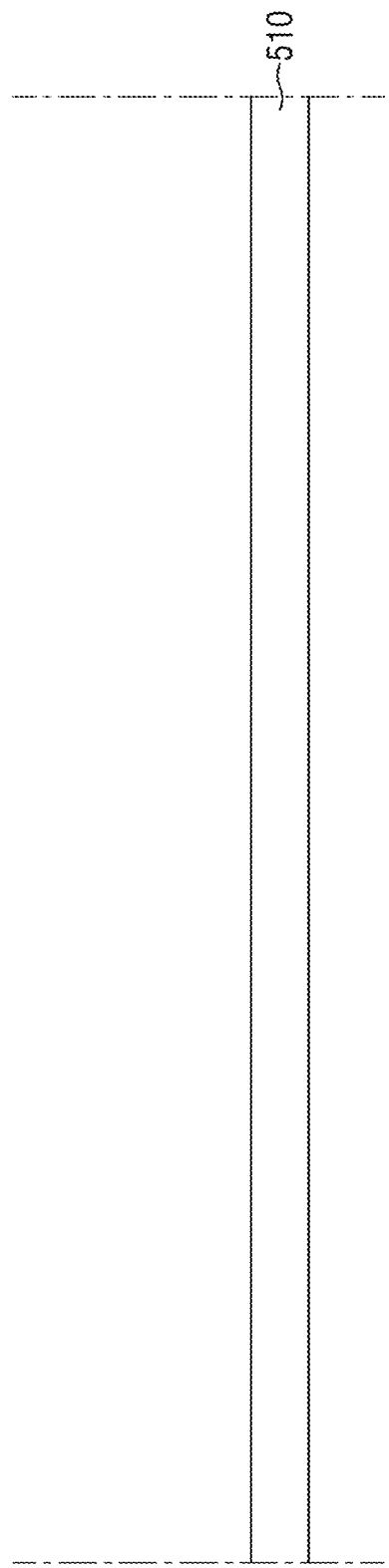
Figure 16:
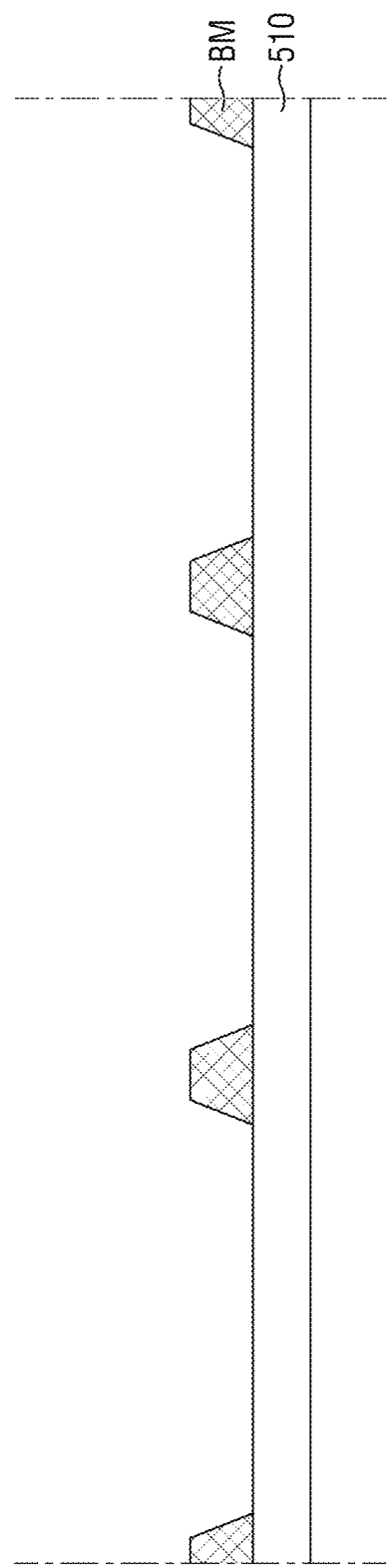
Figure 17:
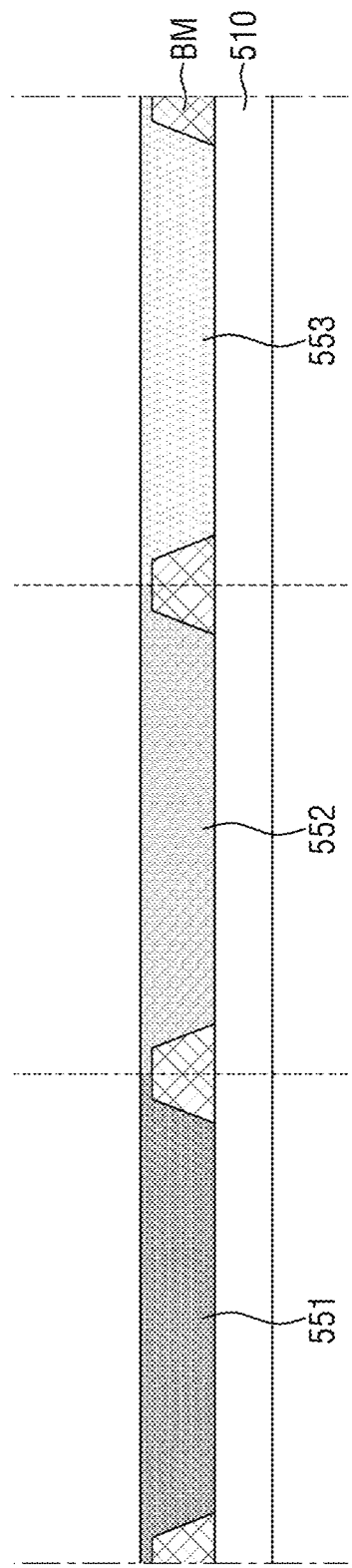

In FIGS. 15-17, light shielding members BM and the color filter layers 550 are disposed on the upper substrate 510 of FIG. 1. For example, it can be understood that, in the display device 10 of FIG. 1, the upper substrate 510 of FIGS. 15-17 is bonded to the light emitting units 300 of FIG. 14 in a state where the upper substrate 510 is turned over such that a lower surface of the upper substrate 510 faces upward.

First, referring to FIG. 15, the upper substrate 510, which is to cover the color conversion layers 520 on the light emitting units 300, is prepared. Before various suitable members are formed on the upper substrate 510, a cleaning process may be performed to remove foreign matter, dust, etc. formed on the upper substrate 510.

Next, referring to FIG. 16, the light shielding members BM are formed on the upper substrate 510. The structures or materials of the upper substrate 510 and the light shielding members BM are as described above.

Next, referring to FIG. 17, the color filter layers 550 are formed on the upper substrate 510 having the light shielding members BM. The color filter layers 550 are disposed on the upper substrate 510 and between the light shielding members BM spaced apart from each other. The color filter layers 550 may selectively transmit light of different colors so that the color conversion unit 500 can emit light of different colors. As illustrated in FIG. 17, the color filter layers 550 may include a first color filter layer 551 which transmits only the red light L1, a second color filter layer 552 which transmits only the green light L2 and a third color filter layer 553 which transmits only the blue light L3. The color filter layers 551 through 553 may be formed by patterning a photosensitive organic material using a photolithography process or by performing an inkjet process. In order to selectively transmit light of different colors, the color filter layers 551 through 553 may include different materials, but the present disclosure is not limited to this case.

Lastly, the display device 10 of FIG. 1 may be manufactured by bonding the upper substrate 510 illustrated in FIG. 17 onto the light emitting units 300 having the color conversion layers 520 illustrated in FIG. 14.

The light emitting elements 350 emitting light of the same color are disposed in the light emitting units 300. Therefore, when the light emitting units 300 and the color conversion unit 500 are attached to each other, light of the same color may be incident on the color filter layers 550 regardless of which light emitting unit 300 is aligned with each of the color filter layers 550. The blue light L3 may be incident on all of the color conversion layers 521 through 523 of the color conversion unit 500, and a mixture of the red light L1, the green light L2 and the blue light L3 may be incident on each of the color filter layers 551 through 553.

In the display device 10 of FIG. 1 manufactured using the above method, red L1 may be displayed on the first pixel PX1, green L2 may be displayed on the second pixel PX2, and blue L3 may be displayed on the third pixel PX3. For example, since the second pixel PX2 converts the blue light L3 received from the light emitting elements 350 into the green light L2 and displays the green light L3, the luminous efficiency of the green light L2 can be improved. In addition, since the number of processes required for manufacturing is reduced compared to display devices otherwise having the same configuration as the display device 10, the process cost can be reduced, and the manufacturing yield can be improved.

Referring again to FIG. 2, the inner barrier ribs 410 and the outer barrier ribs 420 disposed on the light emitting units 300 may be formed by a single mask process in a substantially lattice pattern. However, the outer barrier ribs 420 disposed on the light emitting units 300 respectively overlapping the pixels PX may serve as boundaries between the light emitting units 300. Various embodiments of the outer barrier ribs 420 will now be described in more detail. Only the outer barrier ribs 420 and the inner barrier ribs 410 are illustrated in the drawings so as to describe the structures of the outer barrier ribs 420 and the inner barrier ribs 410.

Figure 18A:
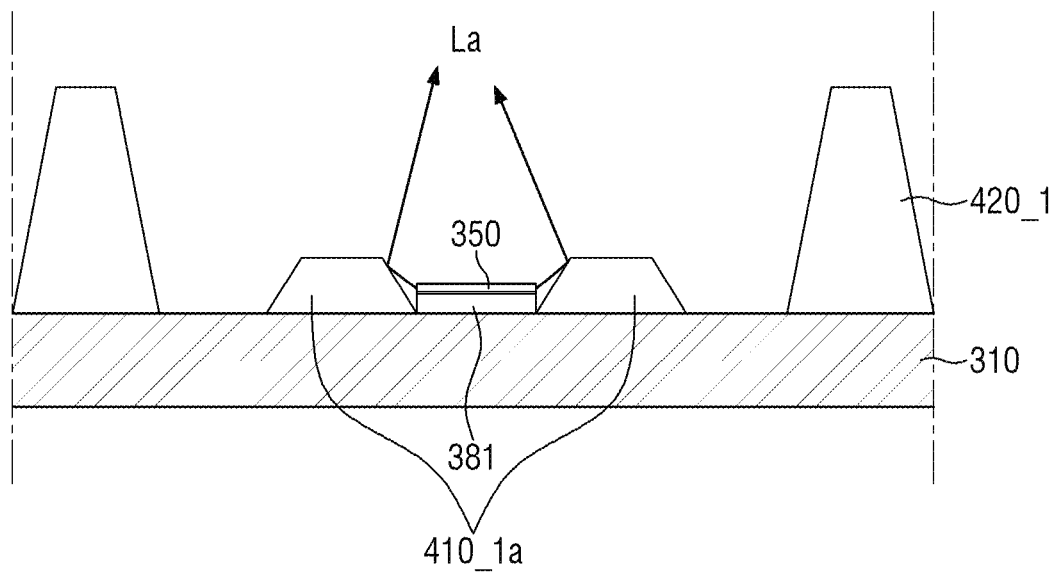
FIGS. 18A-18B are cross-sectional views schematically illustrating the structures of inner barrier ribs and outer barrier ribs according to embodiments.
Figure 18B:
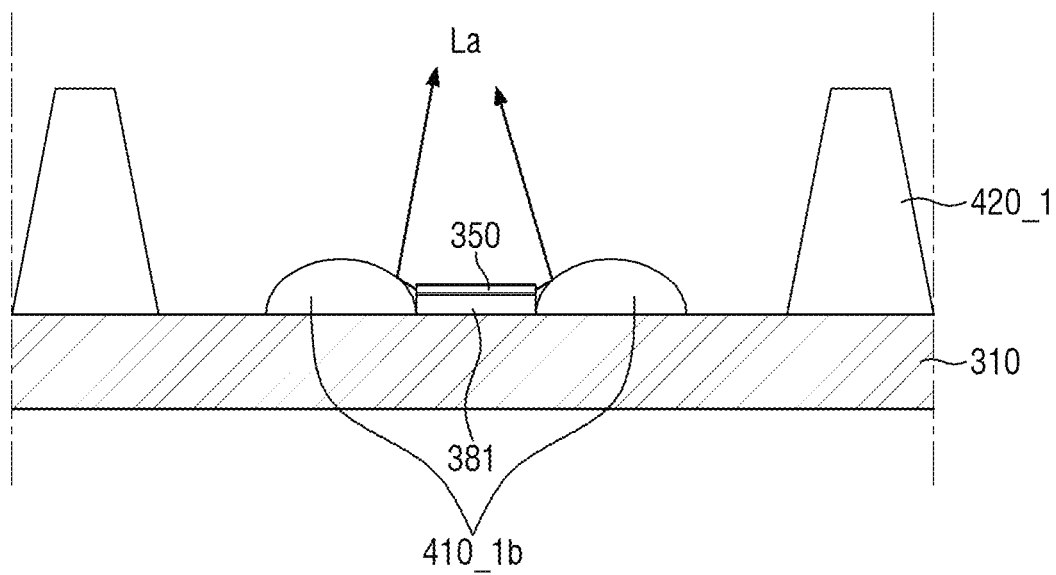

FIGS. 18A-18B are cross-sectional views schematically illustrating the structures of inner barrier ribs and outer barrier ribs according to embodiments. In FIGS. 18A-18B, for ease of description, one first inner barrier rib 411 and one second inner barrier rib 412 are illustrated, and members disposed on the first inner barrier rib 411 and the second inner barrier rib 412 are omitted. Since the structure of the light emitting units 300 has been described above, a redundant description thereof will not be repeated with respect to the following drawings.

Referring to FIG. 18A, inner barrier ribs 410_1a and outer barrier ribs 420_1 have similar shapes, but may have different heights and sizes. As described above, since the inner barrier ribs 410_1a and the outer barrier ribs 420_1 are formed by the same mask process, they may have the same (e.g., substantially the same) size and structure. In addition, the outer barrier ribs 420_1 may be formed higher than the inner barrier ribs 410_1a by using a halftone mask or a slit mask. The outer barrier ribs 420_1 may serve as boundaries for separating each pixel PX of the light emitting unit 300 while preventing an injected light transmitting resin R containing color conversion particles 530 from overflowing to other adjacent light emitting units 300 (or while reducing a likelihood or amount of such overflow).

In addition, as illustrated in the drawing, of light emitted from a light emitting element 350, light La directed toward the inner barrier ribs 410_1a may be reflected by the above-described barrier rib reflective layers (not illustrated) of the inner barrier ribs 410_1a. Also, in some embodiments, of the light emitted from the light emitting element 350, light directed toward the outer barrier ribs 420_1 may be reflected by the outer barrier ribs 420_1. Most of the reflected light may be incident on the color conversion unit 500 and finally displayed on the outside of the display device 10. For example, by concentrating the light emitted from the light emitting element 350 onto the color conversion unit 500, it is possible to reduce leaked light and increase light efficiency. To this end, the outer barrier ribs 420 may be surface-treated for better light reflection.

In FIG. 18A, side surfaces of the inner barrier ribs 410_1a and the outer barrier ribs 420_1 are inclined with respect to the insulating substrate layer 310 and have angled corners. However, the present disclosure is not limited to this case. In an exemplary embodiment, as illustrated in FIG. 18B, an outer surface of each inner barrier rib 410_1b may have a curvature. Accordingly, side surfaces of the inner barrier ribs 410_1b may not be inclined but may be gently curved.

The inner barrier ribs 410 and the outer barrier ribs 420 may also have different structures, unlike in FIGS. 18A-18B. For example, each of the outer barrier ribs 420 may include a first sub-outer barrier rib 421 and a second sub-outer barrier rib 422 disposed on the first sub-outer barrier rib 421. Various embodiments of the inner barrier ribs 410 and the outer barrier ribs 420 will now be described herein below.

Figure 19:
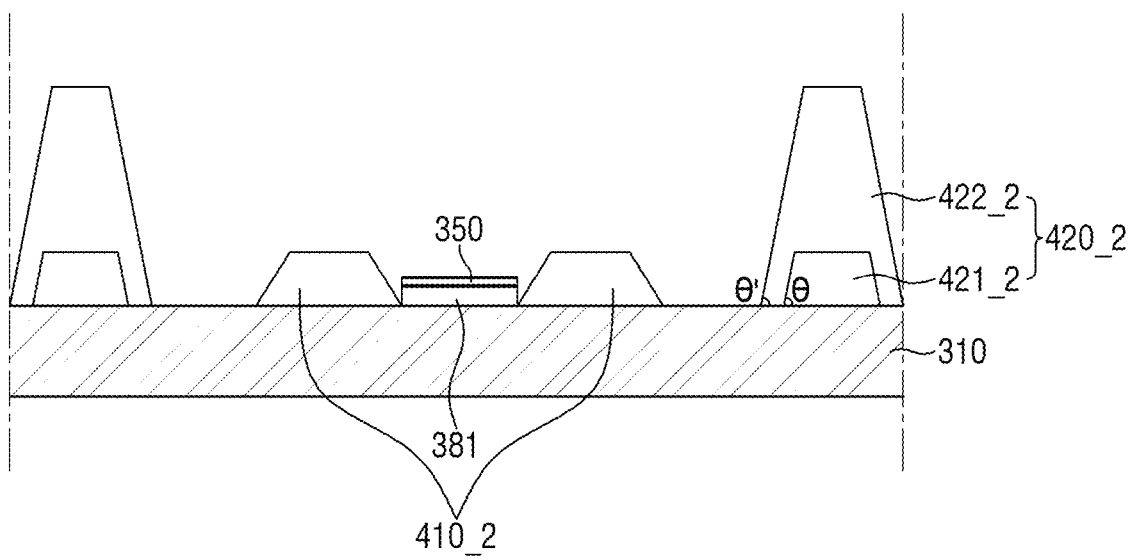
FIGS. 19-20 are cross-sectional views schematically illustrating the structures of outer barrier ribs according to embodiments.
Figure 20:
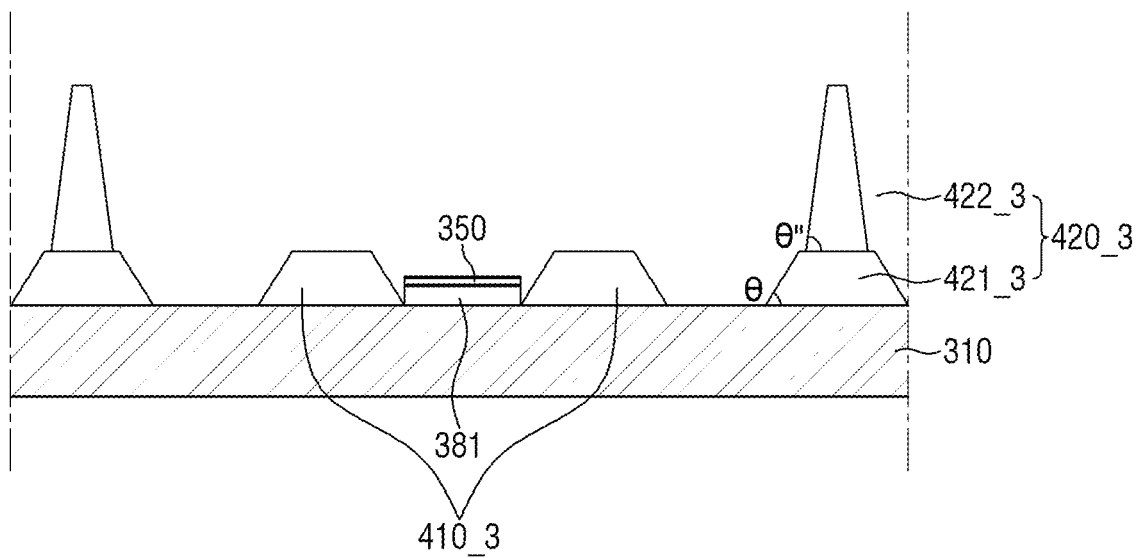

FIGS. 19-20 are cross-sectional views schematically illustrating the structures of outer barrier ribs according to embodiments.

First, referring to FIG. 19, each outer barrier rib 420_2 may include a first sub-outer barrier rib 421_2 having the same (e.g., substantially the same) shape as inner barrier ribs 410_2 and a second sub-outer barrier rib 422_2 disposed on the first sub-outer barrier rib 421_2. The inner barrier ribs 410_2 and the first sub-outer barrier rib 421_2 may be formed by the same mask process. For example, the inner barrier ribs 410_2 and the first sub-outer barrier rib 421_2 may be substantially the same. An additional mask process may be performed on the first sub-outer barrier rib 421_2 to form the second sub-outer barrier rib 422_2. Here, the second sub-outer barrier rib 422_2 may be placed to completely cover an outer surface of the first sub-outer barrier rib 421_2. For example, the length of a lower surface of the second sub-outer barrier rib 422_2 may be greater than the length of a lower surface of the first sub-outer barrier rib 421_2. In addition, angles θ formed by side surfaces of the first and second sub-outer barrier ribs 421_2 and 422_2 and the insulating substrate layer 310 may be equal. Thus, the side surfaces of the first sub-outer barrier rib 421_2 and the second sub-outer barrier rib 422_2 may be parallel (e.g., substantially parallel) to each other. However, the present disclosure is not limited to this case, and the length of the lower surface of the second sub-outer barrier rib 422_2 and the length of the lower surface of the first sub-outer barrier rib 421_2 may also be equal, and the second sub-outer barrier rib 422_2 may be placed to cover the first sub-outer barrier rib 422_2.

In the case of each outer barrier rib 420_2 of FIG. 19, the second sub-outer barrier rib 422_2 is formed to cover the first sub-outer barrier rib 421_2 and to contact the insulating substrate layer 310. However, the present disclosure is not limited to this case, and the second sub-outer barrier rib 422 formed through an additional mask process may also not be formed on the insulating substrate layer 310 but may be formed on an upper surface of the first sub-outer barrier rib 421.

Referring to FIG. 20, a second sub-outer barrier rib 422_3 of each outer barrier rib 420_3 may be disposed on an upper surface of a first sub-outer barrier rib 421_3. In FIG. 20, the length of a lower surface of the second sub-outer barrier rib 422_3 is smaller than the length of the upper surface of the first sub-outer barrier rib 421_3. For example, the second sub-outer barrier rib 422_3 may be included in the upper surface of the first sub-outer barrier rib 421_3. The lower surface of the second sub-outer barrier rib 422_3 may be recessed toward the center from the periphery of the upper surface of the first sub-outer barrier rib 421_3, but the present disclosure is not limited to this case.

In some embodiments, an angle θ formed by side surfaces of the first sub-outer barrier rib 421_3 and the insulating substrate layer 310 and an angle θ" formed by side surfaces of the second sub-outer barrier rib 422_3 and the upper surface of the first sub-outer barrier rib 421_3 are not particularly limited. In the drawing, the angle θ formed by the side surfaces of the first sub-outer barrier rib 421_3 and the insulating substrate layer 310 is larger than the angle θ" formed by the side surfaces of the second sub-outer barrier rib 422_3 and the upper surface of the first sub-outer barrier rib 421_3. However, the present disclosure is not limited to this case, and the two angles θ and θ" may also be equal to each other. For example, the first sub-outer barrier rib 421_3 and the second sub-outer barrier rib 422_3 may be formed as substantially the same mask patterns. Accordingly, the outer barrier ribs 420_3 can be manufactured by performing patterning twice using one mask without manufacturing a separate mask.

In the display device 10 of FIGS. 19-20 described above, the outer barrier ribs 420 may be formed by placing the second sub-outer barrier ribs 422 on the first sub-outer barrier ribs 421 using a mask process. In this case, the first sub-outer barrier ribs 421 may be formed together with the inner barrier ribs 410 in one mask process. For example, it can be understood that the outer barrier ribs 420 are formed by placing the second sub-outer barrier ribs 422 on some of the inner barrier ribs 410 having substantially the same structure.

Referring again to FIG. 1, the color conversion unit 500 disposed on the light emitting units 300 may contact at least parts of the outer barrier ribs 420 and the light shielding members BM, and the outer barrier ribs 420 may support the upper substrate 510 of the color conversion unit 500. Since the light shielding members BM are spaced apart from each other, the color filter layers 550 are disposed in regions formed between the light shielding members BM. The color filter layers 550 may contact side surfaces of the light shielding members BM and may also be disposed on at least parts of lower surfaces of the light shielding members BM. Color filter layers 550 adjacent to each other based on each light shielding member BM, for example, the first color filter layer 551 and the second color filter layer 552 may be spaced apart from each other on the lower surface of the light shielding member BM. An outer barrier rib 420 may contact each light shielding member BM in a region between the first color filter layer 551 and the second color filter layer 552.

According to an embodiment, the outer barrier ribs 420 may support the upper substrate 510 by contacting the light shielding members BM. The outer barrier ribs 420 and the light shielding members BM may respectively be disposed at the boundaries of each light emitting unit 300 and each color conversion unit 500 in order to prevent light emitted from the light emitting elements 350 from being incident on adjacent light emitting units 300 or color conversion units 500. Accordingly, it is possible to prevent color mixing that may occur in each pixel PX of the display device 10 (or to reduce a likelihood of amount of such color mixing). In some embodiments, the outer barrier ribs 420 may extend to contact the upper substrate 510. In this case, the outer barrier ribs 420 may directly contact and support the upper substrate 510, and the light shielding members BM may be partially omitted.

As described above, one first electrode 330 and one second electrode 340 may also be disposed in each light emitting unit 300.

Figure 21:
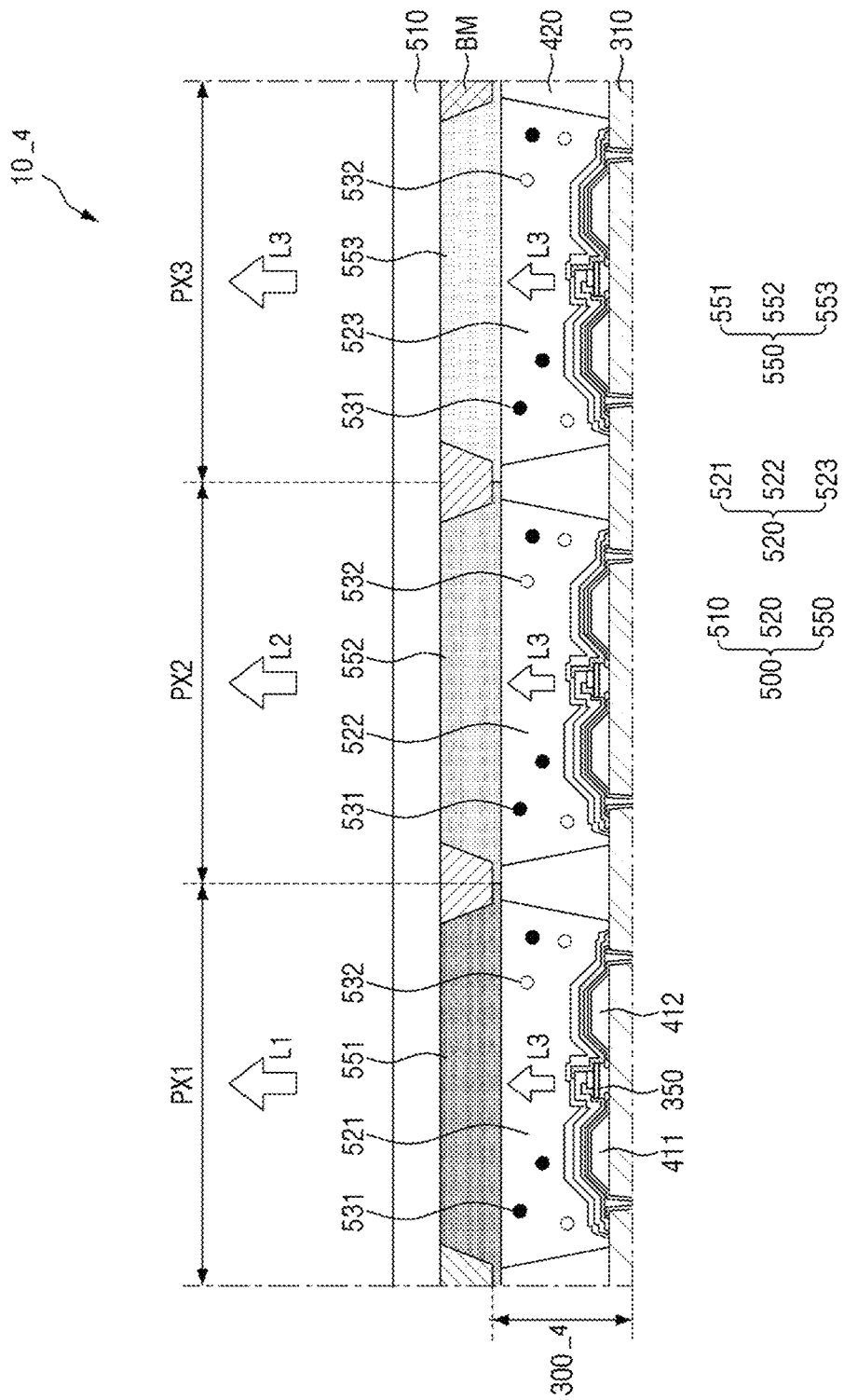
FIG. 21 is a cross-sectional view of a display device according to an embodiment.
Figure 22:
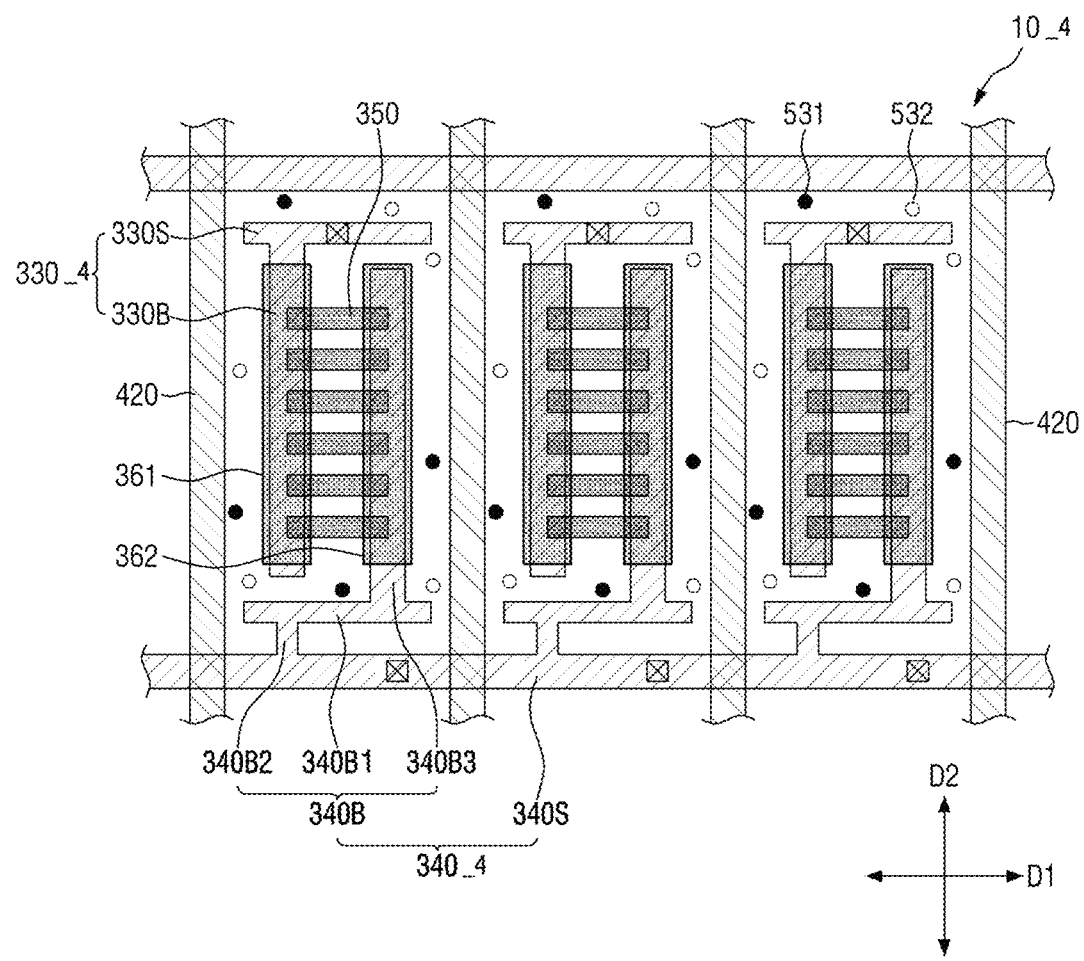
FIG. 22 is a plan view of light emitting units of the display device of FIG. 21.

FIG. 21 is a cross-sectional view of a display device 10_4 according to an embodiment, and FIG. 22 is a plan view of the display device 10_4 of FIG. 21.

Referring to FIGS. 21-22, a light emitting unit 300_4 of the display device 10_4 may include one first electrode 330_4 and one second electrode 340_4 disposed in a region overlapping each pixel PX, and a plurality of light emitting elements 350 may be disposed between the first electrode 330_4 and the second electrode 340_4.

The first electrode 330_4 may include a first electrode stem portion 330S and a first electrode branch portion 330B. The arrangement and structure of the first electrode stem portion 330S and the first electrode branch portion 330B are the same as those described above with reference to FIG. 2. However, in FIG. 21, only one first electrode branch portion 330B branches from the first electrode stem portion 330S and may branch in an arbitrary direction from the center of the first electrode stem portion 330S. The first electrode branch portion 330B is spaced apart from a second electrode branch portion 340B to be described herein below.

The second electrode 340_4 may include a second electrode stem portion 340S and the second electrode branch portion 340B. The second electrode stem portion 340S is the same as that described above with reference to FIG. 2. The differences between the second electrode branch portion 340B of FIG. 21 and the second electrode branch portion 340B of FIG. 2 will be mainly described below.

Each of the first electrode branch portion 330B and the second electrode branch portion 340B may include a plurality of electrically coupled (e.g., electrically connected) structures without extending in one direction. For example, the second electrode branch portion 340B may include a first facing portion 340B1, a second facing portion 340B2 and a connection portion 340B3 which are electrically coupled to (e.g., electrically connected to) each other. In FIG. 21, only the second electrode branch portion 340B has a plurality of structures. However, the present disclosure is not limited to this case, and the first electrode branch portion 330B may also have a plurality of structures.

For example, in the second electrode branch portion 340B, the first facing portion 340B1 may be disposed between the first electrode stem portion 330S and the second electrode stem portion 340S and may be disposed adjacent to the second electrode stem portion 340S. The first facing portion 340B1 may face the second electrode stem portion 340S and extend in the first direction D1. However, unlike the second electrode stem portion 340S, the first facing portion 340B1 of one pixel may be spaced apart from the first facing portions 340B1 of neighboring pixels disposed adjacent in the first direction D1. The first facing portions 340B1 spaced apart from each other may be disposed on a substantially straight line and aligned with each other.

The second facing portion 340B2 may branch from at least a part of the first facing portion 340B1 and may extend in the second direction D2. The second facing portion 340B2 may be spaced apart from the first electrode branch portion 330B to face the first electrode branch portion 330B. The second facing portion 340B2 may be a region where the light emitting elements 350 are substantially disposed in the second electrode branch portion 340B. For example, the light emitting elements 350 may be disposed between the first electrode branch portion 330B and the second facing portion 340B2 of the second electrode branch portion 340B. An end of each of the light emitting elements 350 may be coupled to (e.g., connected to) the second facing portion 340B2.

The connection portion 340B3 may couple (e.g., connect) the first facing portion 340B1 and the second electrode stem portion 340S. The connection portion 340B3 may branch from the second electrode stem portion 340S to extend in the second direction D2 and may end in a state where it is coupled to (e.g., connected to) the first facing portion 340B1. An electrical signal of the second electrode stem portion 340S may be transmitted to the first facing portion 340B1 and the second facing portion 340B2 through the connection portion 340B3.

In some embodiments, the second electrode 340 may include the second electrode stem portion 340S and the second electrode branch portion 340B branching from the second electrode stem portion 340S, and the second electrode branch portion 340B may include the first facing portion 340B1, the second facing portion 340B2 branching from the first facing portion 340B1, and the connection portion 340B3 coupling (e.g., connecting) the first facing portion 340B1 and the second electrode stem portion 340S. The second electrode branch portion 340B of each light emitting unit 300 may transmit the same electrical signal received from the second electrode stem portion 340S to the light emitting elements 350 through the connection portion 340B3, the first facing portion 340B1, and the second facing portion 340B2.

However, the present disclosure is not limited to this case, and the first facing portion 340B1 and the connection portion 340B3 may also be omitted. For example, the second facing portion 340B2 may branch directly from the second electrode stem portion 340S and extend in the second direction D2 to face the first electrode branch portion 340B. Further, in some embodiments, the first electrode 330 may also have the shape illustrated in the drawings by including a first facing portion, a second facing portion and a connection portion.

In addition, as described above, the display device 10 may be manufactured by manufacturing the light emitting units 300 and a color conversion unit 500 in separate processes and attaching the light emitting units 300 and the color conversion unit 500 to each other. For example, color conversion layers 520 may not be directly formed on the light emitting units 300, and separate members may be disposed between the light emitting units 300 and the color conversion unit 500.

Figure 23:
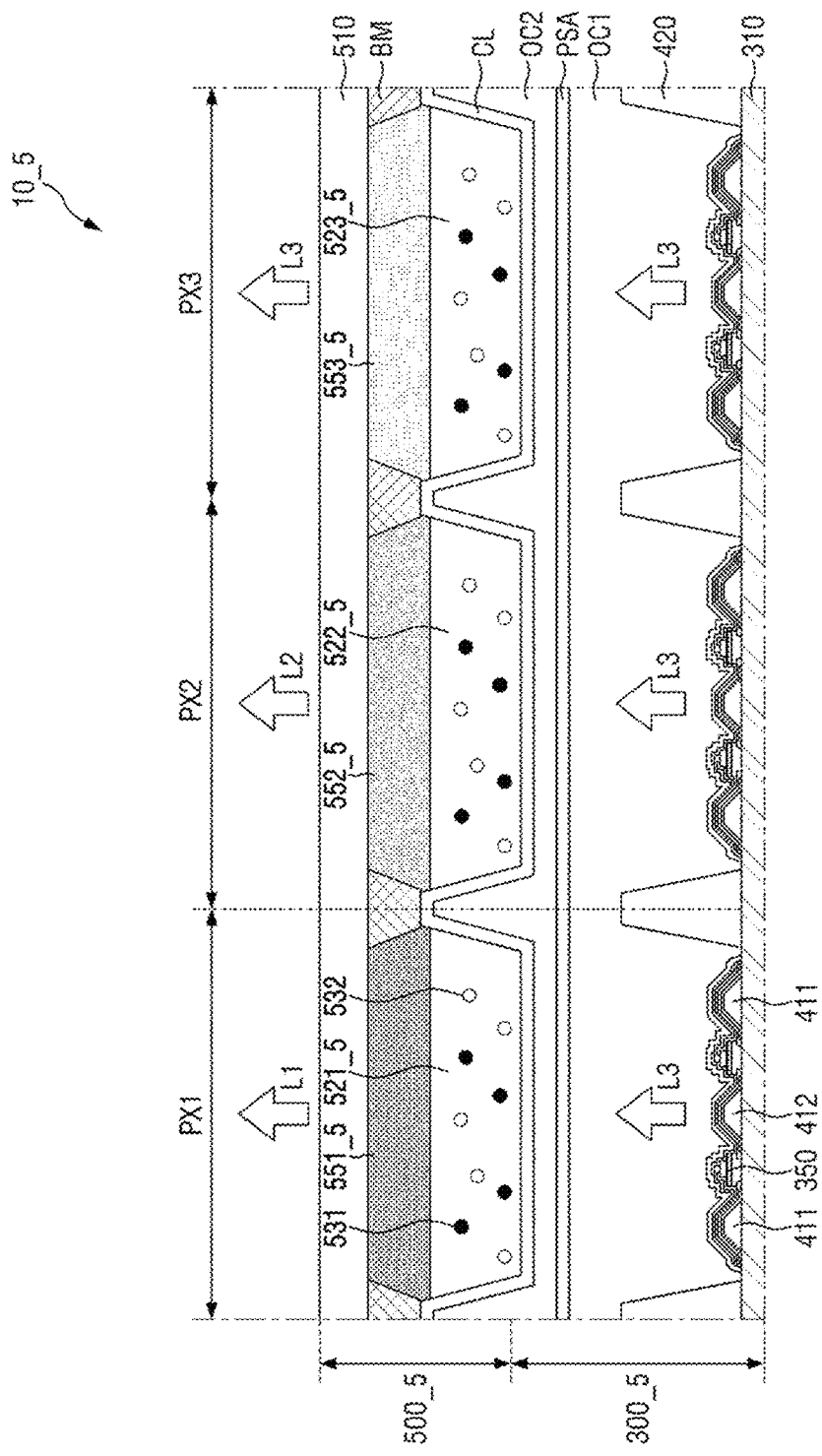
FIG. 23 is a cross-sectional view of a display device according to an embodiment.

FIG. 23 is a cross-sectional view of a display device 10_5 according to an embodiment.

Referring to FIG. 23, the display device 10_5 may include a first planarization layer OC1 which covers a passivation layer 385 of each light emitting unit 300_5 and planarizes an upper surface of each light emitting unit 300_5. A color conversion unit 500_5 may include a capping layer CL which surrounds an outer surface of each color conversion layer 520_5 and a second planarization layer OC2 which covers the capping layer CL. In addition, the first planarization layer OC1 of the light emitting units 300_5 and the second planarization layer OC2 of the color conversion unit 500_5 may be bonded together by an adhesive layer PSA.

The capping layer CL may be disposed on the outer surface of each color conversion layer 520_5 to cover and protect color conversion particles 530 and a light transmitting resin R. In FIG. 23, the capping layer CL is disposed on a surface opposite to a surface of each color conversion layer 520_5 which is in contact with a color filter layer 550_5. However, the present disclosure is not limited to this case, and the capping layer CL may also be disposed on side surfaces of each color conversion layer 520_5 or between the color filter layers 550_5 and the color conversion layers 520_5. In addition, in FIG. 23, one capping layer CL covers all of a first color conversion layer 521_5, a second color conversion layer 522_5, and a third color conversion layer 523_5. However, a plurality of capping layers CL may also cover the color conversion layers 521_5 through 523_5, respectively.

The color conversion unit 500_5 of the display device 10_5 of FIG. 23 may further include a low refractive layer (not illustrated) disposed to surround the outer surface of each color conversion layer 520_5. The low refractive layer is a layer having a refractive index lower than those of the color conversion layers 520_5 and the color filter layers 550_5 and may totally reflect light of a set or specific wavelength band incident from each color conversion layer 520_5 or each color filter layer 550_5. The totally reflected light may be recycled in each color conversion layer 520_5 to improve the light conversion efficiency. When the above low refractive layer is disposed on the outer surface of each color conversion layer 520_5, the capping layer CL may be omitted.

The capping layer CL may include an inorganic material. For example, the capping layer CL may include at least any one selected from silicon oxide ($SiO_x$), silicon nitride ($SiN_x$), and silicon oxynitride ($SiO_xN_y$).

A planarization layer OC may be disposed on the passivation layer 385 of each light emitting unit 300_5 and outer barrier ribs 420. In addition, a planarization layer OC may be disposed on the color conversion layers 520_5, the color filter layers 550_5, light shielding members BM, etc. A planarization layer disposed on the light emitting units 300_5 may be defined as the first planarization layer OC1, and a planarization layer disposed on the color conversion layers 520_5 of the color conversion unit 500_5 may be defined as the second planarization layer OC2.

The first planarization layer OC1 may cover all the members disposed on the light emitting units 300_5 and may planarize the upper surfaces of the light emitting units 300_5. The second planarization layer OC2 may cover all the members disposed on an upper substrate 510. Accordingly, the first planarization layer OC1 and the second planarization layer OC2 may planarize the upper surfaces of the light emitting units 300_5 and a lower surface of the color conversion unit 500_5, thereby minimizing or reducing steps (e.g., surface defects) created by a plurality of members. Since the color conversion unit 500_5 and the light emitting units 300_5 are planarized by the first planarization layer OC1 and the second planarization layer OC2, they can be manufactured through separate processes and easily attached to each other.

The planarization layers OC may include an organic material. For example, the planarization layers OC may include a thermosetting resin. The planarization layers OC may be at least any one selected from, for example, cardo resin, polyimide resin, acrylic resin, siloxane resin, and silsesquioxane resin.

When the color conversion unit 500_5 and the light emitting units 300_5 are bonded together after being manufactured through separate processes, they may be bonded by the adhesive layer PSA. As illustrated in FIG. 23, the adhesive layer PSA may be disposed on the upper surfaces of the light emitting units 300_5 and the surface of the color conversion unit 500_5 planarized by the planarization layer OC to bond the light emitting units 300_5 and the color conversion unit 500_5 together.

The adhesive layer PSA is not limited to a particular type (or kind) as long as it can bond a plurality of members. For example, the adhesive layer PSA may be an optical clear adhesive (OCA), an optical clear resin (OCR), or a pressure sensitive adhesive.

A display device according to an embodiment includes light emitting elements which emit light of a first color and color conversion particles which convert the light of the first color into light of a second color or light of a third color. Therefore, when the display device displaying the light of the first color, the light of the second color and the light of the third color is manufactured, the number of processes required for the manufacture of the display device can be reduced as compared to another display device otherwise having the same configuration as the display device according to the embodiment. Accordingly, it is possible to reduce the process cost required for manufacturing the display device and improve the manufacturing yield. Further, embodiments of the present disclosure can compensate for low light efficiency for a set or specific light.

The effects of the embodiments of the present disclosure are not restricted to the one set forth herein. The above and other effects of the embodiments will become more apparent to one of daily skill in the art to which the embodiments pertain by referencing the claims.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims, and equivalents thereof. The exemplary embodiments should be considered in a descriptive sense only and not for purposes of limitation.

What is claimed is:

1. A display device comprising:
   a substrate comprising a plurality of pixels;
   a plurality of inner walls disposed on each of the pixels, and the inner walls spaced apart from each other;
   a first electrode and a second electrode disposed on each of the pixels, and the first electrode disposed on one of the inner walls, and a second electrode disposed on another one of the inner walls and spaced apart from the first electrode;
   a plurality of light emitting elements disposed between the inner walls spaced apart from each other;
   an outer wall disposed between the pixels and surrounding an area on which the light emitting elements are disposed,
   a plurality of color conversion layers disposed in the area surrounded by the outer wall, and overlapping with the light emitting elements;
   a plurality of color filter layers disposed on the color conversion layers; and
   a light blocking layer disposed between the pixels and surrounding each of the color filter layers;
   wherein each of the light emitting elements comprises a first semiconductor layer, a second semiconductor layer, and an active material layer between the first semiconductor layer and the second semiconductor layer, and
   wherein the first electrode contacts a first side surface of one of the plurality of light emitting elements, the second electrode contacts a second side surface of the one of the plurality of light emitting elements, and the second side surface faces away from the first side surface.

2. The display device of claim 1, wherein the light blocking layer overlaps the outer wall.

3. The display device of claim 1, wherein the light emitting elements emit a first light having a first wavelength, and
   each of the color conversion layers comprises both of first color conversion particles that convert the first light into a second light having a second wavelength longer than the first wavelength and second color conversion particles that convert the first light into a third light having a third wavelength longer than the second wavelength.

4. The display device of claim 3, wherein the color filter layers comprise a first color filter layer disposed on a first pixel, and a second color filter disposed on a second pixel adjacent to the first pixel, and
   the first color filter layer transmits the first light and blocks transmission of the second light and the third light, and
   the second color filter layer transmits the second light and blocks transmission of the first light and the third light.

5. The display device of claim 4, wherein a density of the second color conversion particles dispersed in the color conversion layer on the second pixel is greater than a density of the second color conversion particles dispersed in the color conversion layer on the first pixel.

6. The display device of claim 3, wherein the first light has a central wavelength band of about 430 nm to about 470 nm.

7. The display device of claim 1, wherein the outer wall comprises a first outer wall and a second outer wall disposed on the first outer wall, and
the first outer wall is spaced apart from each of the inner walls.

8. The display device of claim 1, wherein the inner wall comprises a first inner wall disposed on each of the pixels, and a plurality of second inner walls disposed on each of the pixels and spaced apart from each other with the first inner wall interposed therebetween,
the first electrode is disposed on the first inner wall, and the second electrodes are disposed on each of the second inner walls and spaced apart from the first electrode, and
the light emitting elements comprise a first light emitting element disposed between the first inner wall and one of the second inner walls, and a second light emitting element disposed between the first inner wall and another one of the second inner walls.

9. The display device of claim 1, further comprising an insulating layer disposed on the first electrode, the second electrode and the light emitting elements,
wherein the color conversion layers are disposed on the insulating layer.

10. The display device of claim 1, further comprising an upper layer disposed on the color filter layers and the light blocking layer,
wherein the upper layer transmits the first light, the second light, and the third light.

11. A display device comprising:
a substrate comprising a plurality of pixels;
a plurality of inner walls disposed on each of the pixels, and the inner walls spaced apart from each other;
a first electrode and a second electrode disposed on each of the pixels, and the first electrode disposed on one of the inner walls, and a second electrode disposed on another one of the inner walls and spaced apart from the first electrode;
a plurality of light emitting elements disposed between the inner walls spaced apart from each other;
an outer wall disposed between the pixels and surrounding an area on which the light emitting elements are disposed,
a plurality of color conversion layers disposed in the area surrounded by the outer wall, and overlapping with the light emitting elements;
a plurality of color filter layers disposed on the color conversion layers;
a light blocking layer disposed between the pixels and surrounding each of the color filter layers; and
a plurality of capping layers disposed between the color conversion layers and the color filter layers,
wherein each of the light emitting elements comprises a first semiconductor layer, a second semiconductor layer, and an active material layer between the first semiconductor layer and the second semiconductor layer.

12. A display device comprising:
a first pixel and a second pixel;
a plurality of first electrodes disposed on each of the first pixel and the second pixel;
a plurality of second electrodes spaced apart from the first electrodes and disposed on each of the first pixel and the second pixel;
a plurality of light emitting elements disposed on the first electrodes and the second electrodes;
a color conversion layer disposed on the light emitting element of each of the first pixel and the second pixel; and
a color filter layer disposed on the color conversion layer, wherein:
the color conversion layer comprises a first color conversion layer in the first pixel and a second color conversion layer in the second pixel, and
the color filter layer comprises a first color filter layer in the first pixel and a second color filter layer in the second pixel,
wherein each of the light emitting elements emits a first light having a first wavelength,
each of the first color conversion layer and the second color conversion layer comprises both of first color conversion particles that convert the first light into a second light having a second wavelength longer than the first wavelength and second color conversion particles that convert the first light into a third light having a third wavelength longer than the second wavelength,
the first color filter layer transmits the first light and blocks transmission of the second light and the third light, and
the second color filter layer transmits the second light and blocks transmission of the first light and the third light,
wherein each of the light emitting elements comprises a first semiconductor layer, a second semiconductor layer, and an active material layer between the first semiconductor layer and the second semiconductor layer, and
the first semiconductor layer, the active material layer and the second semiconductor layer of each of the light emitting elements are sequentially disposed in a direction parallel to an upper surface of the substrate.

13. The display device of claim 12, wherein a density of the second color conversion particles dispersed in the second color conversion layer is greater than a density of the second color conversion particles dispersed in the first color conversion layer.

14. The display device of claim 12, further comprising:
an outer wall surrounding each of the first pixel and the second pixel; and
a plurality of inner walls disposed on each of the first pixel and the second pixel,
wherein the inner walls comprise first inner walls overlapping with the first electrodes, and second inner walls overlapping with the second electrodes, and
each of the light emitting elements is disposed between the first inner wall and the second inner wall.

15. The display device of claim 12, wherein the first light has a central wavelength band of about 430 nm to about 470 nm.

16. A display device comprising:
a substrate comprising a plurality of pixels arranged in a first direction and a second direction;
a plurality of first electrodes and second electrodes extending in the first direction and spaced apart from each other in the second direction, and each of the first electrodes and the second electrodes disposed on each of the pixels;
a plurality of light emitting elements disposed on the first electrodes and the second electrodes;

an outer wall disposed between the pixels, and surrounding an area in which the light emitting elements are disposed, a plurality of color conversion layers disposed in the area surrounded by the outer wall, and overlapping with the light emitting elements;

a plurality of color filter layers disposed on the color conversion layers; and a light blocking layer disposed between the pixels and surrounding each of the color filter layers;

wherein one of the plurality of first electrodes contacts a first side surface of one of the plurality of light emitting elements, one of the plurality of second electrodes contacts a second side surface of the one of the plurality of light emitting elements, and the second side surface faces away from the first side surface, wherein each of the light emitting element emits a first light having a first wavelength, and wherein the color conversion layers comprise a first color conversion layer and a second color conversion layer, and each of the first color conversion layer and the second color conversion layer comprises both of first color conversion particles that convert the first light into a second light having a second wavelength longer than the first wavelength and second color conversion particles that convert the first light into a third light having a third wavelength longer than the second wavelength.

17. The display device of claim 16, further comprising: a plurality of inner walls disposed on the area surrounded by the outer wall and spaced apart from each other, wherein each of the inner wall overlaps with the first electrode or the second electrode, and the light emitting elements are disposed between respective ones of the inner walls different.

18. The display device of claim 16, further comprising: a third electrode extending in the second direction and a fourth electrode extending in the second direction and spaced apart from the third electrode in the first direction, wherein the first electrode is electrically connected to the third electrode, and the second electrode is electrically connected to the fourth electrode.

19. A display device comprising:

a substrate comprising a plurality of pixels arranged in a first direction and a second direction;

a plurality of first electrodes and second electrodes extending in the first direction and spaced apart from each other in the second direction, and each of the first electrodes and the second electrodes disposed on each of the pixels;

a plurality of light emitting elements disposed on the first electrodes and the second electrodes;

an outer wall disposed between the pixels, and surrounding an area in which the light emitting elements are disposed, a plurality of color conversion layers disposed in the area surrounded by the outer wall, and overlapping with the light emitting elements;

a plurality of color filter layers disposed on the color conversion layers; and a light blocking layer disposed between the pixels and surrounding each of the color filter layers;

wherein each of the light emitting element emits a first light having a first wavelength, wherein the color conversion layers comprise a first color conversion layer and a second color conversion layer, and each of the first color conversion layer and the second color conversion layer comprises both of first color conversion particles that convert the first light into a second light having a second wavelength longer than the first wavelength and second color conversion particles that convert the first light into a third light having a third wavelength longer than the second wavelength, and wherein a distance between the second electrodes of the adjacent pixels in the second direction is greater than a distance between the first electrodes of the adjacent pixels in the second direction.

20. The display device of claim 19, wherein at least a portion of the outer wall is disposed between the first electrodes of the adjacent pixels in the second direction.

* * * * *

UNITED STATES PATENT AND TRADEMARK OFFICE
CERTIFICATE OF CORRECTION

PATENT NO. : 11,682,693 B2
APPLICATION NO. : 17/316339
DATED : June 20, 2023
INVENTOR(S) : Dong Uk Kim et al.

Page 1 of 1

It is certified that error appears in the above-identified patent and that said Letters Patent is hereby corrected as shown below:

In the Claims
Column 45, Line 34, Claim 17      Delete "walls diffterent." and
                                  Insert -- walls different with each other. --

Signed and Sealed this
Fifteenth Day of August, 2023

Katherine Kelly Vidal
*Director of the United States Patent and Trademark Office*